United States Patent
Ohishi et al.

(10) Patent No.: US 9,269,581 B2
(45) Date of Patent: Feb. 23, 2016

(54) METHOD OF PRODUCING SOLAR CELL

(71) Applicant: PVG Solutions Inc., Yokohama-shi (JP)

(72) Inventors: Seiji Ohishi, Kawasaki (JP); Katsuya Tanitsu, Kawasaki (JP); Shinji Goda, Saijo (JP); Takayuki Ogino, Saijo (JP); Futoshi Kato, Saijo (JP); Ayumu Imai, Saijo (JP); Yasuyuki Kano, Yokohama (JP)

(73) Assignee: PVG SOLUTIONS INC., Yokohama-Shi (JP)

( * ) Notice: Subject to any disclaimer, the term of this patent is extended or adjusted under 35 U.S.C. 154(b) by 0 days.

(21) Appl. No.: 14/522,076

(22) Filed: Oct. 23, 2014

(65) Prior Publication Data

US 2015/0118786 A1  Apr. 30, 2015

(30) Foreign Application Priority Data

Oct. 31, 2013  (JP) .................. 2013-226685

(51) Int. Cl.
  *H01L 21/225*  (2006.01)
  *H01L 21/316*  (2006.01)
  *H01L 21/02*  (2006.01)
  *H01L 21/312*  (2006.01)
  *H01L 31/068*  (2012.01)
  *H01L 31/18*  (2006.01)
  (Continued)

(52) U.S. Cl.
  CPC ...... *H01L 21/2254* (2013.01); *H01L 21/02118* (2013.01); *H01L 21/02282* (2013.01); *H01L 21/2255* (2013.01); *H01L 21/312* (2013.01); *H01L 21/316* (2013.01); *H01L 31/068* (2013.01); *H01L 31/1804* (2013.01); *H01L 31/02167* (2013.01)

(58) Field of Classification Search
  CPC ............... H01L 31/02363; H01L 31/1804; H01L 31/068
  USPC .............................................. 438/71
  See application file for complete search history.

(56) References Cited

U.S. PATENT DOCUMENTS 4,571,366 A    2/1986  Thomas et al.
7,157,386 B2 *  1/2007  Andres et al. ............... 438/782
(Continued)

FOREIGN PATENT DOCUMENTS

JP    A-03-076109    4/1991
JP    A-2012-030160   2/2012

OTHER PUBLICATIONS

Search Report in European Application No. 14190367.4, mailed Mar. 12, 2015.

*Primary Examiner* — Victor A Mandala
*Assistant Examiner* — Regan J Rundio
(74) *Attorney, Agent, or Firm* — Knobbe Martens Olson & Bear LLP

(57) ABSTRACT

A method of producing a solar cell, including: a first coating step in which a pre-wet composition is spin-coated on a surface of a semiconductor substrate; a second coating step in which a diffusing material including a solvent and a diffusing agent containing a first impurity element is spin-coated on the surface where the pre-wet composition has been spin-coated, so as to form a coating film of the diffusing agent; and a first impurity diffusion layer forming step in which the semiconductor substrate having the coating film formed thereon is heated, so as to form a first impurity diffusion layer in which the impurity element contained in the diffusing agent is diffused.

4 Claims, 11 Drawing Sheets

(51) Int. Cl.
*B05D 1/26* (2006.01)
*H01L 31/0216* (2014.01)

(56) References Cited

U.S. PATENT DOCUMENTS 8,334,163 B1 * 12/2012 Hu et al. ................. 438/71

| | | | |
|---|---|---|---|
| 2002/0160319 A1 | 10/2002 | Endo | |
| 2009/0226621 A1 * | 9/2009 | Yamashita et al. | 427/346 |
| 2010/0267187 A1 * | 10/2010 | Funakoshi | 438/72 |
| 2011/0054119 A1 * | 3/2011 | Rutter et al. | 524/588 |
| 2012/0021611 A1 * | 1/2012 | Yoshihara et al. | 438/782 |
| 2012/0160306 A1 * | 6/2012 | Hirai et al. | 136/252 |
| 2013/0109123 A1 * | 5/2013 | Morita et al. | 438/57 |

* cited by examiner

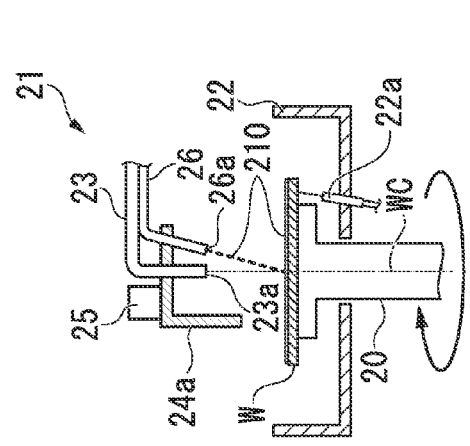
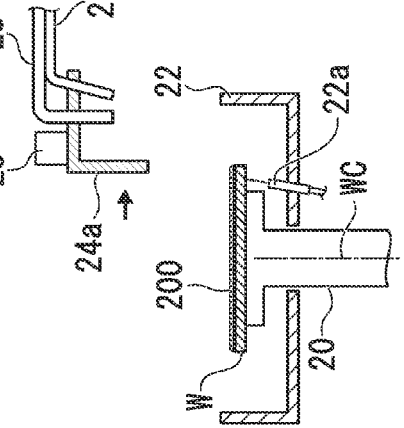
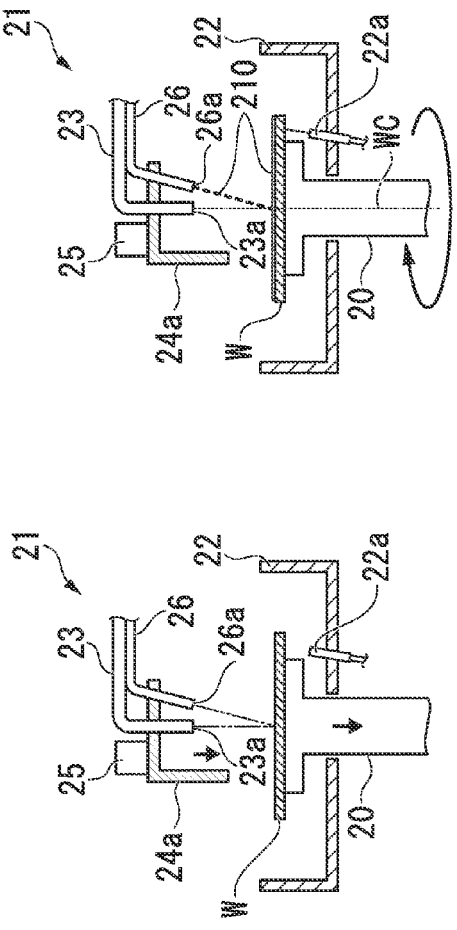
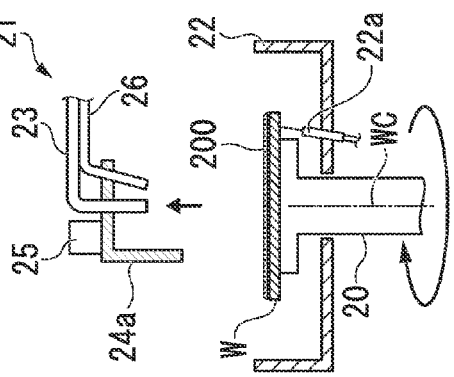
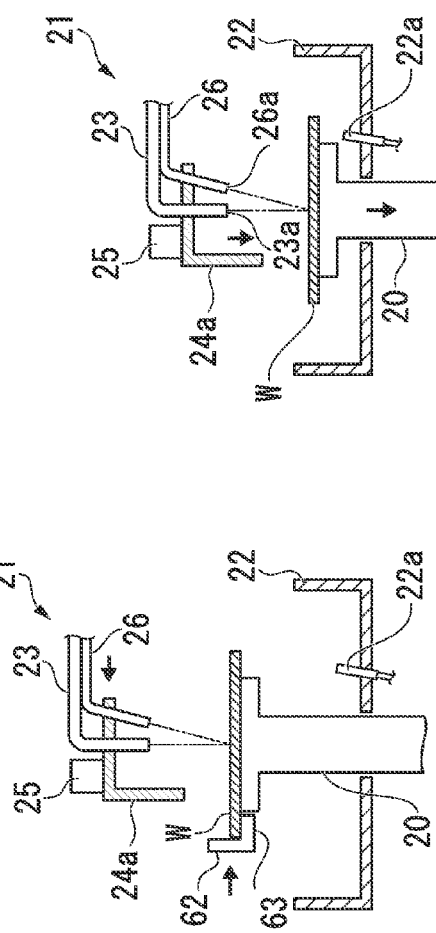
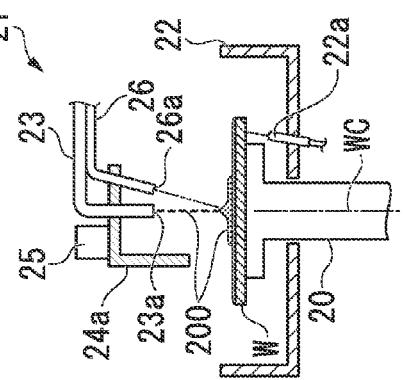

METHOD OF PRODUCING SOLAR CELL

FIELD OF THE INVENTION

The present invention relates to a method of producing a solar cell.

Priority is claimed on Japanese Patent Application No. 2013-226685, filed Oct. 31, 2013, the content of which is incorporated herein by reference.

DESCRIPTION OF THE RELATED ART

In recent years, solar cell is attracting attention in various applications. In the production process of a solar cell, there is a step in which a diffusing agent is applied to a surface of a semiconductor substrate. There have been demands for producing solar cells at low costs and short tact time (cycle time).

As a method of applying a diffusing agent, there is known a method in which a diffusing agent is applied by spin-coating (for example, see Patent Literature 1).

As a method of applying a liquid material by spin-coating method, in the field of resist application, a technique in which a coating solution containing a resist material is known. Spin-coating is a technique which enables formation of a coating film with a uniform film thickness. Therefore, for example, spin-coating is employed in the step of resist application in a process of forming a semiconductor device by a photolithography technology.

DOCUMENTS OF RELATED ART

Patent Documents

[Patent Literature 1] Japanese Unexamined Patent Application, First Publication No. 2012-30160

SUMMARY OF THE INVENTION

When a coating film is formed on a substrate by spin-coating, most of the coating solution supplied onto the substrate is scattered outwardly from the substrate by a centrifugal force, and a coating film is formed by the coating solution remaining on the substrate.

Thus, a large portion of the coating solution used would be wasted.

In the formation of a solar cell, when a diffusing agent is applied by spin-coating in the manner as described in Patent Literature 1, a large amount of the expensive diffusing agent would be wasted. Further, in order to produce a solar cell at a low cost by using spin-coating, if the amount of diffusing agent is merely reduced, the coating solution would not spread to the edge of the substrate, such that the coating film is not formed at some portions. Further, formation defect of the coating film is likely to occur, such as formation of voids in the coating film. Therefore, in order to uniformly apply a diffusing agent, it becomes necessary to use a large amount of the diffusing agent, thereby resulting in difficulty to meet the demands to produce a solar cell at a "low cost".

On the other hand, in the field of resist application, when a coating film is formed on a substrate by spin-coating, the rotation time of the substrate is set to be long (for example, about 30 seconds to about 1 minute), so as to even the film thickness of the coating film. In the formation of a solar cell, when a diffusing agent is applied by spin-coating in the manner as described in Patent Literature 1, if the rotation time of the substrate is shortened in order to shorten the tact time, uneven coating is likely to occur, and it becomes difficult to form a uniform coating film. Therefore, it was difficult to meet the demands for producing a solar cell with "a short tact time".

The present invention takes the above circumstances into consideration, with an object of providing a method of producing a solar cell which may suppress the amount of the diffusing agent used, and also suppress formation defect of the coating film of the diffusing agent while shortening the tact time.

A method of producing a solar cell according to one aspect of the present invention includes: a first coating step in which a pre-wet composition is spin-coated on one face of a semiconductor substrate; a second coating step in which a diffusing material including a solvent and a diffusing agent containing a first impurity element is spin-coated on the one face where the pre-wet composition has been spin-coated, so as to form a coating film of the diffusing agent; and a first impurity diffusion layer forming step in which the semiconductor substrate having the coating film formed thereon is heated, so as to form a first impurity diffusion layer in which the first impurity element contained in the diffusing agent is diffused.

According to the above method, the diffusing material can be spin-coated in a state where the substrate surface is wetted with the pre-wet composition. As a result, the diffusing material can be reliably wet-spread in a short time.

Further, since the diffusing material is wet-spread over the entire face of one face of the substrate while compatibilizing with the pre-wet composition, even if the amount of the diffusing agent used is small, the diffusing material can be effectively wet-spread over entire face of one face of the substrate, so as to easily form a coating film of the coating agent on the entire face of the one face of the substrate.

Thus, there can be provided a method of producing a solar cell which may suppress the amount of the diffusing agent used, and also suppress formation defect of the coating film of the diffusing agent while shortening the tact time.

In one embodiment according to the present invention, the method may include, prior to the first coating step, a step in which a textured structure (concave/convex structure) is formed on at least the one face of the substrate.

According to the above method, the one face having the textured structure formed is capable of more reliably holding the pre-wet composition, and the entire face of the one face becomes capable of more reliably maintaining a wet state with the pre-wet composition in the form of a film. As a result, spin-coating of the diffusing material becomes easier.

In one embodiment according to the present invention, the method may include, in the second coating step, forming the coating film in a semi-dried state.

According to the above method, the tact time can be shortened, as compared to the case where the rotation of the substrate is stopped after entirely drying the coating film. Further, since the rotation time of the substrate is shortened, the coating film is unlikely to be adversely affected by wind shear.

In one embodiment according to the present invention, the method may include, from the start of the first coating step to the end of the second coating step, continuously conducting spin-coating without stopping rotating the semiconductor substrate.

According to the above method, a centrifugal force is constantly applied to the pre-wet composition and the diffusing material applied to the one face. As a result, the pre-wet composition and the diffusing material are scattered around the substrate without sneaking to the other face of the substrate, thereby suppressing contamination of the other face.

In one embodiment according to the present invention, in the method, the maximum substrate rotation number in the second coating step may be larger than the maximum substrate rotation number in the first coating step, and in the second coating step, after supplying the diffusing material to the one face, the substrate rotation number in the first coating step may be increased to the substrate rotation number in the second coating step.

According to the above method, uneven coating of the diffusing material is unlikely to occur.

In one embodiment according to the present invention, the method may include, after the first impurity diffusion layer forming step, a second impurity diffusion layer forming step in which a second impurity diffusion layer having a second impurity element diffused is formed on the other face of the semiconductor substrate.

According to the above method, a high performance solar cell can be produced.

According to the present invention, there can be provided a method of producing a solar cell which may suppress the amount of the diffusing agent used, and also suppress formation defect of the coating film of the diffusing agent while shortening the tact time.

BRIEF DESCRIPTION OF THE DRAWINGS

FIG. 13A is an explanatory diagram showing a coating process by a coating apparatus.

FIG. 13B is an explanatory diagram showing a coating process by a coating apparatus.

FIG. 13C is an explanatory diagram showing a coating process by a coating apparatus.

FIG. 13D is an explanatory diagram showing a coating process by a coating apparatus.

FIG. 13E is an explanatory diagram showing a coating process by a coating apparatus.

FIG. 13F is an explanatory diagram showing a coating process by a coating apparatus.

DETAILED DESCRIPTION OF THE INVENTION

Hereinafter, one embodiment of the method of producing a solar cell according to the present invention will be described with reference to the accompanying drawings. It should be noted that, in all drawings, for making the drawings conspicuous, the size and proportion of each component are appropriately adjusted.

Figure 1:
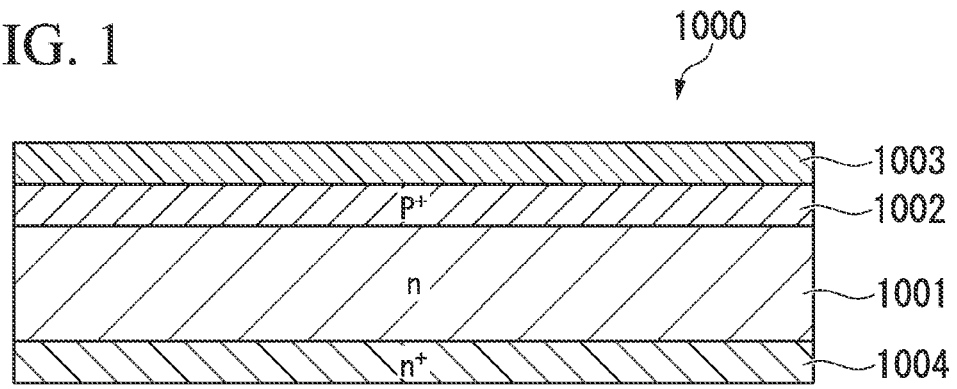
FIG. 1 is a schematic cross-sectional view showing an example of a solar cell substrate produced by the method of producing a solar cell according to the present embodiment.

FIG. 1 is a schematic cross-sectional view showing an example of a solar cell substrate produced by the method of producing a solar cell according to the present embodiment.

The solar cell substrate 1000 includes an n-type silicon layer (nSi layer) 1001, a $p^+$-type silicon layer ($p^+$Si layer) 1002, an oxide film 1003 and an $n^+$-type silicon layer ($n^+$Si layer) 1004.

The nSi layer 1001 is a layer of an n-type semiconductor, and is obtainable, for example, by diffusing an impurity element belonging to group 15 of the periodic table into a monocrystalline silicon. Examples of group 15 element include phosphorous (P), arsenic (As) and antimony (Sb). In the present embodiment, explanation will be given with respect to a case where P is contained as an impurity element. As the group 15 element, 1 kind of element may be used, or 2 or more kinds of elements may be used in combination.

The $p^+$Si layer 1002 is a layer of a p-type semiconductor, and is obtainable, for example, by diffusing an impurity element belonging to group 13 of the periodic table into a monocrystalline silicon. Examples of group 13 element include boron (B) and gallium (Ga). The impurity element diffused in the $p^+$Si layer 1002 corresponds to the "first impurity element" in the present invention. In the present embodiment, explanation will be given with respect to a case where B is contained as an impurity element. As the group 13 element, 1 kind of element may be used, or 2 or more kinds of elements may be used in combination.

The oxide film 1003 is an oxide film formed by the impurity element contained in the $p^+$Si layer 1002, the silicon contained in the monocrystalline silicon substrate, and oxygen bonded together. In the present embodiment, explanation will be given with respect to a case where a borosilicate glass is formed as the oxide film.

The n⁺Si layer 1004 is a layer of an n-type semiconductor, and is obtainable, for example, by diffusing an impurity element belonging to group 15 of the periodic table into a monocrystalline silicon. Further, the n⁺Si layer 1004 has higher impurity element concentration than the nSi layer 1001. The impurity element diffused in the n⁺Si layer 1004 corresponds to the "second impurity element" in the present invention. Examples of the group 15 element are the same as defined for those usable for the nSi layer 1001. In the present embodiment, explanation will be given with respect to a case where P is contained as an impurity element. As the group 15 element, 1 kind of element may be used, or 2 or more kinds of elements may be used in combination.

In the solar cell substrate 1000 shown in FIG. 1, after removing the oxide film 1003, the surface is subjected to a passivation treatment, followed by imparting electrodes to the front and rear surfaces, thereby constituting a solar cell.

Figure 2:
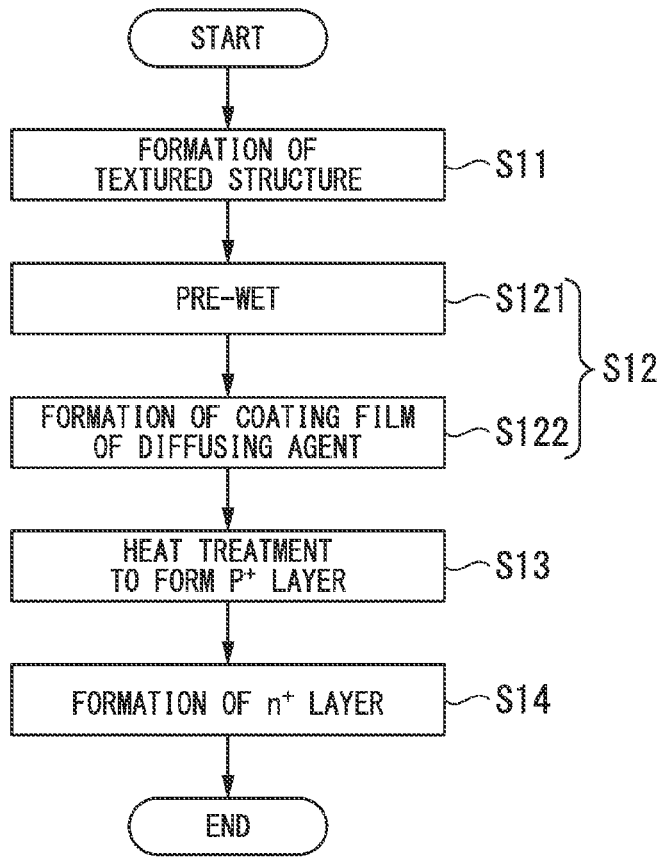
FIG. 2 is a flow chart showing the method of producing a solar cell according to the present embodiment.

FIG. 2 is a flow chart showing the method of producing a solar cell according to the present embodiment. As shown in FIG. 2, the method of producing a solar cell according to the present embodiment includes the steps of forming a textured structure on the substrate surface (textured structure forming step; step S11), pre-wetting of the substrate surface (first coating film forming step; step S121 of step S12), applying a diffusing material (second coating film forming step; step S122 of step S12), forming a p⁺ layer (first impurity diffusion layer forming step; step S13) and forming an n⁺ layer (second impurity diffusion layer forming step; step S14).

Step S121 and step S122 are part of the step of forming a coating film of the diffusing agent (step S12).

Figure 3A:
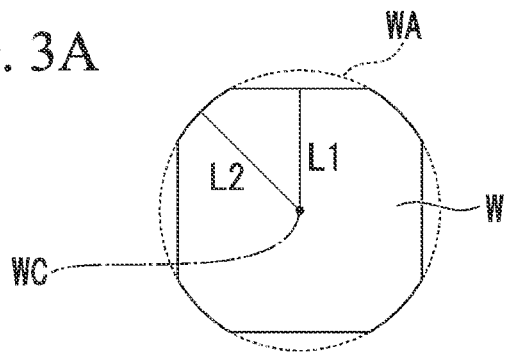
FIG. 3A is a process diagram showing the method of producing a solar cell according to the present embodiment.
Figure 3B:
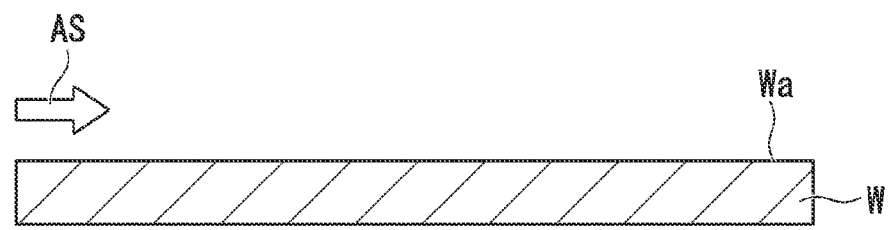
FIG. 3B is a process diagram showing the method of producing a solar cell according to the present embodiment.
Figure 3C:
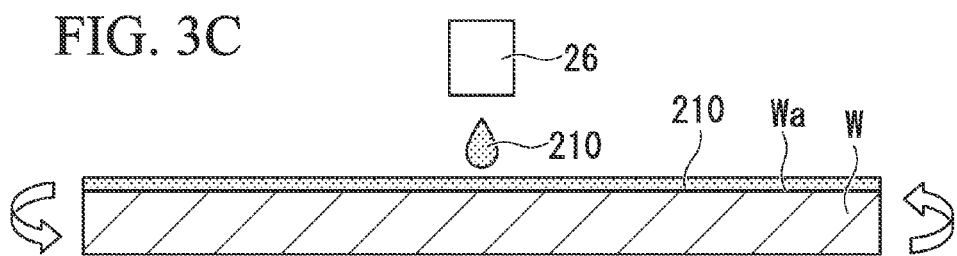
FIG. 3C is a process diagram showing the method of producing a solar cell according to the present embodiment.
Figure 3D:
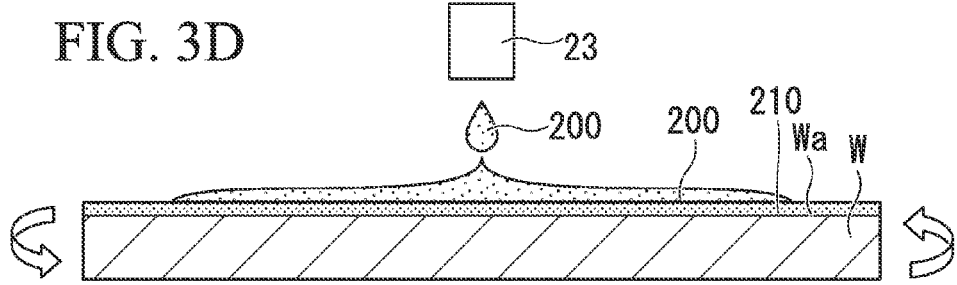
FIG. 3D is a process diagram showing the method of producing a solar cell according to the present embodiment.
Figure 3E:
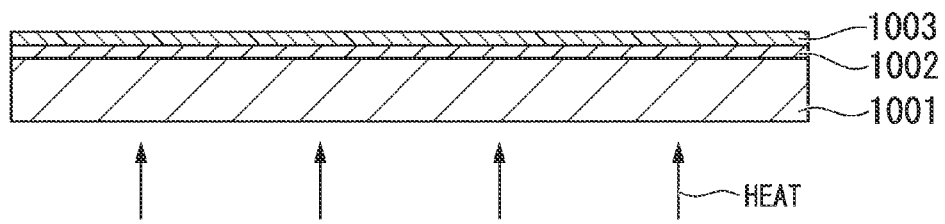
FIG. 3E is a process diagram showing the method of producing a solar cell according to the present embodiment.
Figure 4A:
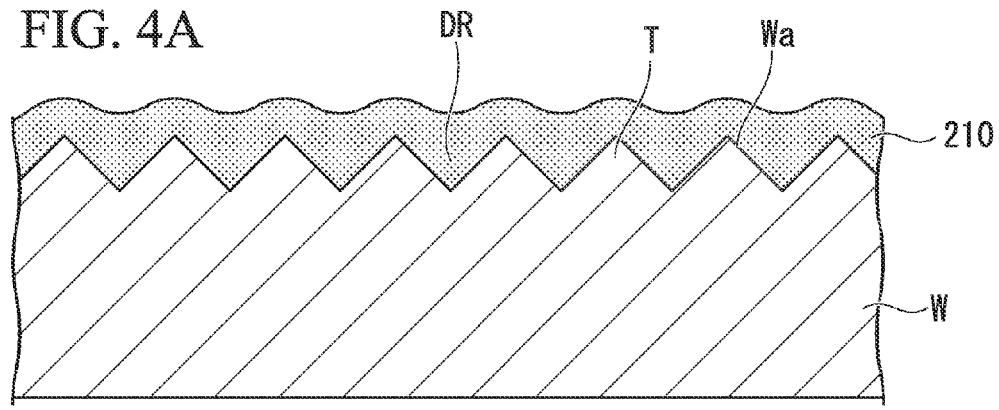
FIG. 4A is a partially enlarged view showing the method of producing a solar cell according to the present embodiment.
Figure 4B:
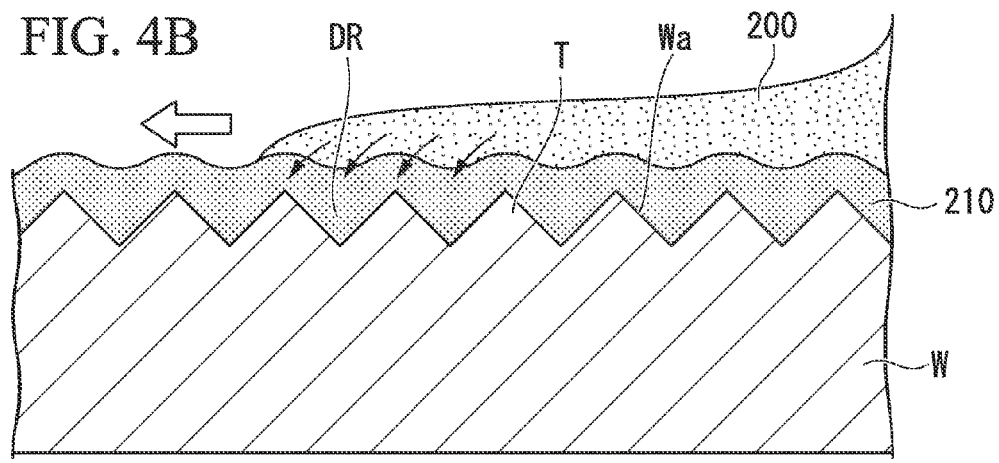
FIG. 4B is a partially enlarged view showing the method of producing a solar cell according to the present embodiment.

FIG. 3A to FIG. 3E, FIG. 4A, FIG. 4B and FIG. 5 are explanatory diagrams showing the method of producing a solar cell according to the present embodiment. FIG. 3A to FIG. 3E and FIG. 5 are process diagrams, and FIG. 4A and FIG. 4B are partially enlarged views of FIG. 3C and FIG. 3D, respectively.

Hereinbelow, the method of producing a solar cell will be explained with reference to FIG. 2 to FIG. 5.

(Textured Structure Formation Step)

As shown in FIG. 3A, substrate W used in the method of producing a solar cell according to the present embodiment is a wafer WA having a circular shape in the plane view, in which part of the arc of the wafer WA is cut, so as to have a rectangular shape with rounded corners.

Such processing of the substrate W may be part of the production process of the solar cell. Alternatively, the production process of the solar cell may be conducted using a substrate W which has already been processed to have a rectangular shape.

As the wafer WA, for example, a cylindrical ingot of a mono crystalline silicon or the like produced by the CZ process (Czochralski process), the FZ process (Floating Zone process) or the like which is thinly cut in the direction perpendicular to the axial direction of the cylinder may be used. Further, in order to render the wafer WA an n-type semiconductor, a group 15 impurity element is diffused entirely in the wafer WA in advance.

In general, as a solar cell, a solar cell unit is produced from a solar cell substrate, a plurality of solar cell units are connected to produce a solar cell module, and a plurality of solar cell modules are connected and arranged to obtain an array structure. Typically, a solar cell module is rectangular. Therefore, the wafer WA is processed to a rectangular substrate W with rounded corners, so as to improve the efficiency of installing the substrate W in a module. The obtained substrate W does not have a constant distance from the center portion WC of the substrate W to the outer periphery of the substrate W, and has a difference from the shortest distance L1 to the longest distance L2.

In the method of forming a solar cell according to the present embodiment, firstly, as shown in FIG. 3B, one face Wa of the substrate W is entirely subjected to an etching treatment with an alkali solution AS, so as to form a textured surface (step S11 in FIG. 2). When the face Wa of the substrate W made of a monocrystalline silicon is subjected to etching with the alkali solution AS, due to the difference in the solubility depending on the crystal orientation, anisotropic etching is applied in line with the crystal orientation, and a textured structure (concave-convex structure) is formed over the entire face Wa. Etching is conducted, for example, until the height of the textured structure becomes about 0.3 μm to 20 μm.

In a solar cell provided with such textured structure on the light receiving face, for example, as compared to a solar cell in which a face subjected to a mirror finishing (such as a wafer for a semiconductor device) is used as a light receiving face, light is reflected or refracted on the textured structure, so as to be more reliably directed into the substrate. As a result, the utilization efficiency of solar light becomes high, thereby enabling a solar cell with high generation efficiency.

(First Coating Step)

Subsequently, as shown in FIG. 3C, a pre-wet composition 210 is supplied from a nozzle 26 to one face Wa of the substrate W, followed by spin-coating, thereby forming a film of the pre-wet composition 210 over the entire face Wa (step S121 in FIG. 2). The detailed coating conditions are described later.

In the present embodiment, such forming of a film of a pre-wet composition of a surface of the substrate W is sometimes referred to as "pre-wetting".

As the pre-wet composition, it is preferable to use an organic solvent. Examples of organic solvent include a monohydric alcohol, such as methanol, ethanol, propanol or butanol; an alkylcarboxylic acid ester, such as methyl-3-methoxy propionate or ethyl-3-ethoxy propionate; a polyhydric alcohol, such as ethylene glycol, diethylene glycol or propylene glycol; a polyhydric alcohol derivative, such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, 3-methoxy-3-methyl-1-butanol, 3-methoxy-1-butanol, ethylene glycol monomethyl ether acetate, ethylene glycol monoethyl ether acetate, propylene glycol monomethyl ether acetate; a fatty acid, such as acetic acid or propionic acid; ketone, such as acetone, methyl ethyl ketone or 2-heptanone.

Among these examples, in the present embodiment, it is preferable to use a protic polar solvent, such as the aforementioned monohydric alcohol, polyhydric alcohol, and polyhydric alcohol derivative, such as ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, 3-methoxy-3-methyl-1-butanol, and 3-methoxy-1-butanol.

As the pre-wet composition, one kind of organic solvent may be used, or a combination of organic solvents may be used. Further, the pre-wet composition may be mixed with water.

The organic solvent used as the pre-wet composition preferably has a boiling point of 30 to 200° C. Further, water to be used is preferably a deionized water (DIW).

The pre-wet composition 210 is preferably a mixed solvent of a protic polar solvent and water. As the protic polar solvent, a monohydric alcohol or a polyhydric alcohol derivative is preferable. Since a highly water-soluble organic solvent is advantageous in preparing a mixed solvent, methanol, ethanol, propanol or butanol is preferable as the monohydric alcohol, and ethylene glycol monomethyl ether, ethylene glycol monoethyl ether or propylene glycol monomethyl ether is preferable as the polyhydric alcohol.

As a specific example of the pre-wet composition 210, a 1:1 mixed solvent of propylene glycol monomethyl ether (PGME) and pure water may be mentioned. The mixed solvent of PGME:DIW=1:1 is preferable as compared to a mixed solvent with increased amount of PGME (e.g., a mixed solvent of PGME:DIW=2:1) in that the diffusing agent described later can be more reliably dissolved and a coating film of the diffusing agent can be more reliably formed. Further, as compared to a mixed solvent with a reduced amount of PGME (PGME:DIW=1:2), the mixed solvent of PGME:DIW=1:1 is preferable in that the mixed solvent can be more reliably spread on the surface of the substrate W during the spin-coating.

In the present embodiment, explanation will be given with respect to a case where a mixed solvent of PGME:DIW=1:1 is used as the pre-wet composition 210.

(Second Coating Step)

Subsequently, as shown in FIG. 3D, to the face Wa of the substrate W, a diffusing material 200 containing a diffusing agent is supplied from the nozzle 23, followed by spin-coating, thereby forming a coating film of the diffusing agent over the entire face Wa (step S122 in FIG. 2). The detailed coating conditions are described later.

The diffusing material 200 is a liquid material including a solvent and a diffusing agent containing an impurity element. Examples of the impurity element include the aforementioned group 13 element and the group 15 element. Other examples of the impurity element include zinc and copper.

As the diffusing agent contained in the diffusing material 200, an oxide, a halide, an inorganic salt such as a nitrate or a sulfate, an organic acid salt such as an acetate, or an organic compound, each of which containing an impurity element, may be used.

Specific examples of the diffusing agent include a boron compound, such as $B_2O_3$, $(RO)_3B$, $RB(OH)_2$ or $R_2B(OH)$; a gallium compound, such as $(RO)_3Ga$, $RGa(OH)$, $RGa(OH)_2$ or $R_2Ga[OC(CH_3)=CH-CO-(CH_3)]$; a phosphor compound, such as $P_2O_5$, $NH_4H_2.PO_4$, $(RO)_3P$, $(RO)_2P(OH)$, $(RO)_3PO$, $(RO)_2P_2O_3(OH)_3$ or $(RO)P(OH)_2$; an arsenic compound, such as $H_3AsO_3$, $H_2AsO_4$, $(RO)_3As$, $(RO)_5As$, $(RO)_2As(OH)$, $R_3AsO$ or $RAs=AsR$; an antimony compound, such as $H_3SbO_4$, $(RO)_3Sb$, $SbX_3$, $SbOX$ or $Sb_4O_5X$; and a zinc compound, such as $Zn(OR)_2$, $ZnX_2$ or $Zn(NO_2)_2$. In the above formulae, R represents a halogen atom, an alkyl group, an alkenyl group or an aryl group, and X represents a halogen atom. Among these compounds, boron oxide ($B_2O_3$) or phosphorous oxide ($P_2O_5$) may be preferably used.

In the present embodiment, explanation will be given with respect to a case where boron oxide is used as the diffusing agent.

As the solvent contained in the diffusing material 200, the same solvents as those described above for the pre-wet composition 210 may be used. As the solvent contained in the diffusing material 200, it is preferable to use the same solvent as that used as the pre-wet composition 210. In the present embodiment, explanation will be given with respect to a case where a mixed solvent of PGME:DIW=1:1 is used as the solvent contained in the diffusing agent 200.

Further, for forming a dielectric film, a leveling film or a protective film simultaneously with diffusion of the diffusing material 200, the diffusing material 200 may contain a hydrolysis/polycondensation product obtainable from at least one alkoxysilane represented by the formula: $R^1{}_n Si(OR^2)_{4-n}$ as a starting material. In the formula, $R^1$ represents a hydrogen atom or a monovalent organic group, $R^2$ represents a monovalent organic group, and n represents an integer of 1 to 3.

Examples of the monovalent organic group for the alkoxysilane include an alkyl group, an aryl group, an allyl group and a glycidyl group. Among these examples, an alkyl group and an aryl group is preferable.

The alkyl group preferably has 1 to 5 carbon atoms. Examples of the alkyl group include a methyl group, an ethyl group, a propyl group and a butyl group. The alkyl group may be straight-chained or branch-chained, and a hydrogen atom may be substituted with fluorine. The aryl group preferably has 6 to 20 carbon atoms. Examples of the aryl group include a phenyl group and a naphthyl group.

Specific examples of the alkoxysilane represented by the formula $R^1{}_n Si(OR^2)_{4-n}$ in which n=1 to 3, are as follows.

(i) In the case where n=1, an alkyl trialkoxysilane, such as methyl trimethoxysilane, methyl triethoxysilane, methyl tripropoxysilane, ethyl trimethoxysilane, ethyl triethoxysilane, ethyl tripropoxysilane, propyl trimethoxysilane or propyl triethoxysilane; a phenyl trialkoxysilane, such as phenyl trimethoxysilane or phenyl triethoxysilane.

(ii) In the case where n=2, a dialkyl dialkoxysilane, such as dimethyl dimethoxysilane, dimethyl diethoxysilane, dimethyl dipropoxysilane, diethyl dimethoxysilane, diethyl diethoxysilane, diethyl dipropoxysilane, dipropyl dimethoxysilane or dipropyl diethoxysilane; and a diphenyl dialkoxysilane, such as diphenyl dimethoxysilane or diphenyldiethoxysilane.

(iii) In the case where n=3, a trialkylalkoxysilane, such as trimethyl methoxysilane, trimethyl ethoxysilane, trimethyl propoxysilane, triethyl methoxysilane, triethyl ethoxysilane, triethyl propoxysilane, tripropyl methoxysilane or tripropyl ethoxysilane; and a triphenyl alkoxysilane, such as triphenyl methoxysilane or triphenyl ethoxysilane.

Among these examples, a methyl trialkoxysilane, such as methyl trimethoxysilane, methyl triethoxysilane or methyl tripropoxysilane may be preferably used.

The viscosity of the diffusing material 200 is preferably 0.7 mPa·s to 50 mPa·s (0.7 cP to 50 cP). When the viscosity is from 0.7 mPa·s to 50 mPa·s, uneven coating is unlikely to occur, and a coating film with a satisfactory film thickness can be reliably obtained. Further, it becomes possible to spread the diffusing material 200 over the face Wa under the conditions where the substrate rotation speed is reduced during spin-coating, such that splashed diffusing material 200 is unlikely to get adhered to the other face of the substrate W.

By spin-coating such diffusing material 200 and continuing rotation of the substrate W, the solvent contained in the diffusing material 200 is volatilized, and a coating film of the diffusing agent is formed over the entire face Wa. The film thickness of the coating film of the diffusing agent obtained after drying is preferably from 3,000 Å to 10,000 Å.

The pre-wetting shown in FIG. 3C and FIG. 3D, and the formation of the coating film of the diffusing agent will be described with reference to FIG. 4A and FIG. 4B. FIG. 4A is a partially enlarged view corresponding to FIG. 3C, and FIG. 4B is a partially enlarged view corresponding to FIG. 3D.

Firstly, as shown in FIG. 4A, when the pre-wet composition 210 is spin-coated on the face Wa, the pre-wet composition 210 is wet-spread as far as the edge of the substrate W while being retained in the groove portion (drain portion) DR of the textured structure T. That is, the face Wa having the textured structure formed is capable of more reliably holding the pre-wet composition 210 than in the case of a mirror-finished surface, and the entire face of the face Wa becomes capable of more reliably maintaining a wet state with the pre-wet composition 210 in the form of a film.

Subsequently, as shown in FIG. 4B, diffusing material 200 is supplied to the face Wa, followed by spin-coating. In FIG. 4B, the state where the diffusing material 200 is wet-spread is indicated by the white arrow.

Generally, in the case where a liquid material is spin-coated on a surface of a substrate having a textured structure, the liquid material moving on the substrate surface is impeded by the textured structure. Therefore, it is difficult to wet-spread the liquid material as compared to the case where the liquid material is spin-coated on a substrate having a mirror-finished surface.

However, in the present embodiment, a film of the pre-wet composition 210 is formed on the face Wa by pre-wetting, and by virtue of the pre-wet composition 210 being retained in the groove portion DR, the textured structure is relieved. Therefore, when the diffusing material 200 is spin-coated, the diffusing material 200 can be reliably wet-spread in a short time, as compared to the case where pre-wetting is not conducted.

Further, the diffusing material 200 is spread as far as the edge of the substrate W by the centrifugal force of spin-coating while compatibilizing with the film of the pre-wet composition 210 formed on the dace Wa. FIG. 4B shows the state of the diffusing material 200 dissolving in the pre-wet composition 210 by black arrows.

In the method of producing a solar cell according to the present embodiment, by virtue of the textured structure T being formed on the face Wa, the pre-wet composition 210 is satisfactorily held at the groove portion DR, and the diffusing material 200 can be spread as far as the edge of the substrate W while dissolving the diffusing material 200 in the pre-wet composition 210. Since the film of the pre-wet composition 210 is formed over the entire face Wa, the diffusing material 200 can be spread over the entire face Wa by the above method, such that a coating film of the diffusing agent can be reliably formed over the entire face Wa.

Furthermore, even if the amount of diffusing material 200 supplied is small, such that the amount of the diffusing agent used is small, the diffusing agent 200 can be efficiently wet-spread over the entire face Wa, and a coating film of the diffusing agent can be reliably formed on the entire face Wa.

Moreover, as described above, since the diffusing material 200 is wet-spread while being compatibilized with the film of the pre-wet composition 210, in the production method according to the present embodiment, the diffusing material 200 applied exhibits a viscosity lower than the viscosity at the time of being supplied to the face Wa. For example, in the case where a diffusing material with a low viscosity is prepared, and spin-coating is conducted, the diffusing material sneaks to the face of the substrate on the other side (the face opposite to the face Wa), and likely to contaminate the other face. However, as in the production method according to the present embodiment, by virtue of spin-coating while reducing the viscosity of the supplied diffusing material 200, the other face is unlikely to be contaminated, and hence, the step of cleaning the other face can be omitted.

(First Impurity Diffusion Layer Forming Step)

Subsequently, as shown in FIG. 3E, the substrate W having a coating film of the diffusing agent is heated, so as to diffuse the impurity element on the substrate, thereby forming an impurity diffusion layer on the surface of the substrate (step S13 of FIG. 2).

Specifically, the diffusing agent is decomposed by the heat treatment, and the generated impurity element is thermally diffused to from the surface of the substrate W made of monocrystalline silicon, thereby forming an impurity diffusion layer on the surface of the substrate W. In the present embodiment, since boron oxide is used as the diffusing agent, a $p^+$-type Si layer 1002 which is a $p^+$ layer is formed as an impurity diffusion layer. In FIG. 3E, in the substrate W, the portion other than the $p^+$Si layer 1002 is indicated as the nSi layer 1001.

Further, on the surface of the substrate, boron contained in the diffusing agent, silicon contained in the substrate W and oxygen in air are reacted, so as to form an oxide film 1003 made of borosilicate glass.

(Second Impurity Diffusion Layer Forming Step)

Figure 5:
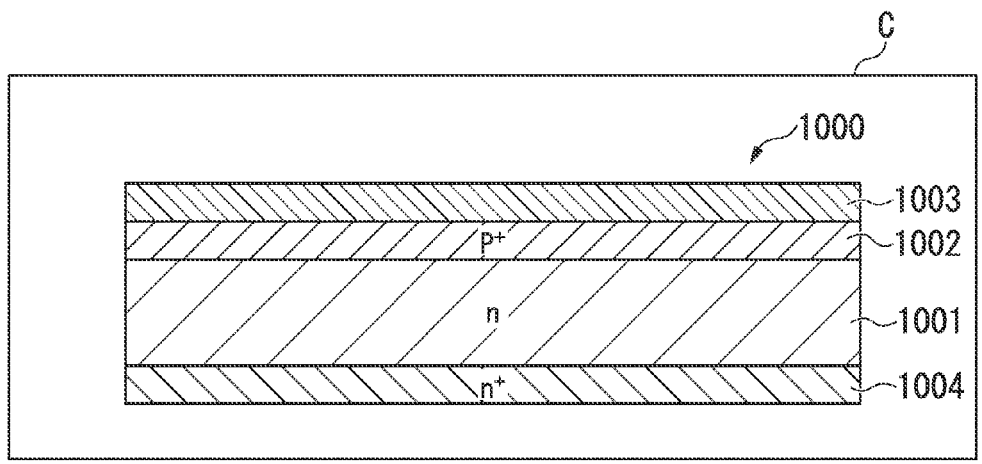
FIG. 5 is a process diagram showing the method of producing a solar cell according to the present embodiment.

Subsequently, as shown in FIG. 5, a second impurity element is diffused on the other face of the substrate (opposite face of the face Wa), so as to form an impurity diffusion layer (step S14 in FIG. 2).

For example, as shown in FIG. 5, the substrate having the $p^+$Si layer 1002 and the oxide film 1003 formed is disposed inside a chamber C, a gas containing a group 15 element is introduced into the chamber C, and the inside of the chamber C is heated, thereby forming an impurity diffusion layer. In the present embodiment, as the gas containing a group 15 element, $POCl_3$ is used, so as to form a $n^+$Si layer 1004 as the $n^+$-type layer.

Further, in the same manner as in the formation of the $p^+$Si layer 1002, after forming a coating layer of the diffusing agent containing a group 15 element on the other face, heat treatment may be conducted.

In the present embodiment, in such a manner, a solar cell substrate 1000 usable in the production of a solar cell is produced.

In the following steps, suitable components are imparted, for example, on the surface of the solar cell substrate 1000 corresponding to the aforementioned one face, an anti-reflection film may be imparted, and on the other surface of the solar cell substrate 1000 corresponding to the aforementioned other face, and electrodes are provided on both surfaces, thereby producing a solar cell.

Figure 6A:
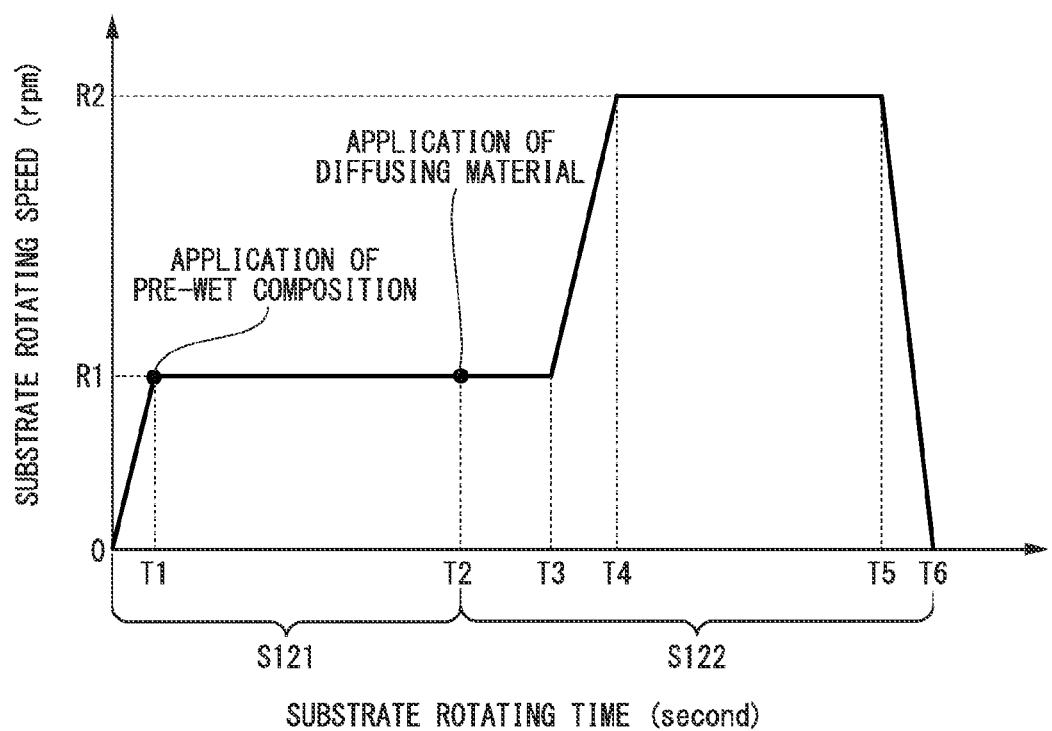
FIG. 6A is an explanatory diagram showing preferable conditions for the first coating step and the second coating step.
Figure 6B:
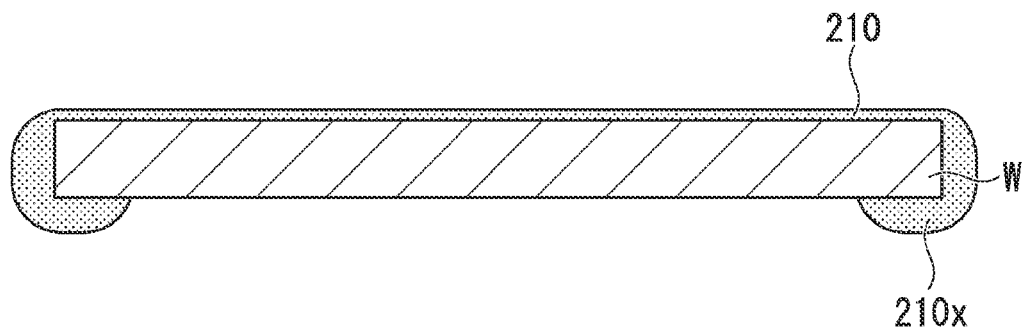

FIG. 6A and FIG. 6B are explanatory diagrams showing preferable conditions for the first coating step and the second coating step.

FIG. 6A is an explanatory diagram showing conditions for spin-coating in the first coating step and the second coating step. In FIG. 6A, the horizontal axis indicates the rotation time (unit:seconds) of the substrate W during spin-coating, and the vertical axis indicates the rotation speed (unit: rpm) of the substrate W during spin-coating.

As shown in FIG. 6A, in the first coating step, the substrate at a stationary state is rotated up to a rotation speed R1 by the time T1. After reaching the predetermined rotation speed R1, the pre-wet composition 210 is applied to the face Wa of the substrate W, and spin-coating is conducted while maintaining the rotation speed at R1 from the time T1 until the time T2.

Thereafter, in the second coating step, while maintaining the rotation speed of the substrate W at R1, the diffusing material 200 is applied to the face Wa, and spin-coating is conducted while maintaining the rotation speed at R1 from the time T2 until the time T3.

Subsequently, from the time T3 to the time T4, the rotation speed of the substrate W is accelerated from R1 to R2, and spin-coating is conducted while maintaining the rotation speed at R2 from the time T4 until the time T5.

Subsequently, from the time T5 to the time T6, the rotation speed of the substrate W is reduced from R2 to 0 rpm, and the second coating step is finished.

The rotation time of the substrate from the start to T1 may be appropriately selected, considering the tact time. For example, the rotation time from the start to T1 is 0.01 to 0.2 seconds.

The rotation time from T1 to T2 is, for example, 0.5 to 5 seconds. In the production method according to the present embodiment, the rotation time from T1 to T2 is 5 seconds.

The rotation time from T2 to T3 is, for example, 0.5 to 1 second. In the production method according to the present embodiment, the rotation time from T2 to T3 is 1 second.

The rotation time from T3 to T4 is, for example, 0.1 to 1 second.

The rotation time from T4 to T5 is, for example, 3 to 8 second. In the production method according to the present embodiment, the rotation time from T4 to T5 is 5 seconds.

The rotation time from T5 to T6 is, for example, 0.1 to 1 second.

Further, with respect to the rotation time, R1 is 800 rpm to 3,000 rpm, and R2 is 1,000 rpm to 5,000 rpm. R1 is the maximum rotation speed of the substrate in the first coating step, and R2 is the maximum rotation speed of the substrate in the second coating step. In the production method according to the present embodiment, R1 is 800 rpm, and R2 is 3,000 rpm.

In the spin-coating conditions shown in FIG. 6A, the spin-coating in the first coating step and the second coating is step is conducted continuously without stopping the rotation of the substrate W from the start of the first coating step to the end of the second coating step. If the rotation of the substrate W is stopped between the first coating step and the second coating step, as shown in FIG. 6B, the pre-wet composition 210 spin-coated in the first coating step sneaks to the other face of the substrate W (opposite face of the face Wa) by self-weight, so as to contaminate the other face. However, if the substrate W is continuously rotated between the first coating step and the second coating step, a centrifugal force is constantly applied to the pre-wet composition 210. As a result, the pre-wet composition 210 is scattered around the substrate without sneaking to the other face of the substrate, thereby suppressing contamination of the other face.

Further, by continuously rotating the substrate W without stopping from the start of the first coating step to the end of the second coating step, other problems may be solved.

The substrate used in the production method according to the present embodiment, as shown in FIG. 3A, does not have a constant distance from the central portion WC of the substrate W to the outer periphery of the substrate W. When such a substrate which does not have a constant distance from the central portion WC to the outer periphery of the substrate W is rotated, the substrate is rotated while the edge of the substrate W, in particular, the straight line portion formed by cutting the substrate hits the surrounding air. Therefore, the surrounding air is moved, and an air stream is likely to be generated. Hereafter, such phenomenon is referred to as "wind shear".

When air is vigorously moved by wind shear, droplets of the diffusing material 200 and the pre-wet composition 210 scattered by spin-coating are carried by the flow of air and reach the other face of the substrate W, thereby contaminating the other face. The wind shear due to the shape of the substrate W inevitably occurs. Therefore, in the production method according to the present invention, operation conditions capable of reducing the influence of the wind shear during spin-coating as much as possible is necessary.

From the view point of the above, the total of the rotation time of the substrate is preferably shorter in that spin-coating can be finished before air is moved too much by the wind shear. Further, the change in the rotation speed of the substrate is preferably smaller in that movement of air is unlikely to be disturbed by the wind shear.

As described above, by virtue of not stopping the rotation of the substrate W between the first coating step and the second coating step, the change in the rotation speed of the substrate can be reduced from the start of the first coating step to the end of the second coating step.

Furthermore, by setting the rotation time of the substrate in the above-described time range, the tact time can be suppressed to about 15 to 18 seconds, and contamination of the other face of the substrate W by the wind shear can be suppressed.

Moreover, in the second coating step, it is preferable to control the time from T4 to T5, so as to form a coating film of the diffusing agent in a semi-dried state. Here, a coating film of the diffusing agent is "in a semi-dried state" means that the fluidity of the diffusing agent 200 is impaired, but the solvent is remaining such that natural drying of the coating film can be visually observed when allowed to stand at room temperature. For example in the case where rotation is continued at rotation speed R2 for 60 seconds to form a coating film, the coating film will be satisfactorily dried, not semi-dried.

By stopping the rotation of the substrate when the coating film is in a semi-dried state, and the second coating step is finished, the tact time can be shortened, as compared to the case where the rotation of the substrate is stopped after entirely drying the coating film. Further, since the rotation time of the substrate is shortened, the coating film is unlikely to be adversely affected by wind shear.

Furthermore, as shown in the figure, in the second coating step, it is preferable that, after supplying the diffusing material 200 to one face, the substrate rotation number in the first coating step is increased to the substrate rotation number in the second coating step. In this manner, uneven coating of the diffusing material 200 is unlikely to occur.

In the production method according to the present invention, since pre-wetting is conducted before forming a coating film of the diffusing agent on the face Wa of the substrate W, when the diffusing material 200 containing the diffusing agent is spin-coated, the diffusing material 200 is satisfactorily wet-spread on the face Wa. Therefore, the coating film of the diffusing agent formed becomes an excellent coating film with no defects such as voids and uncoated parts. The effects of forming such a coating film will be explained below.

Figure 7A:
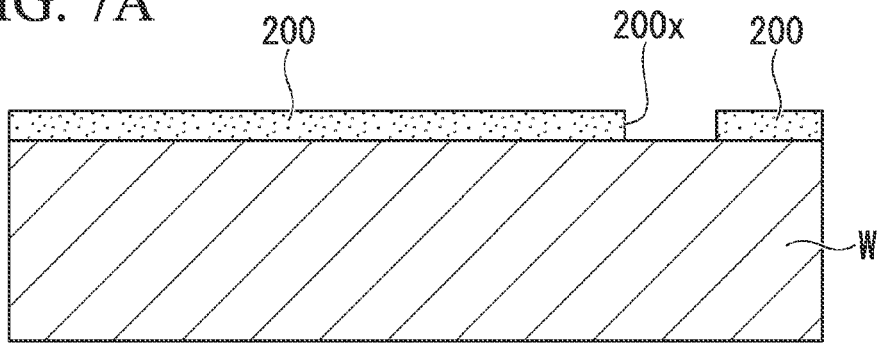
FIG. 7A is an explanatory diagram showing the defect caused in the case where pre-wetting is not conducted.
Figure 7B:
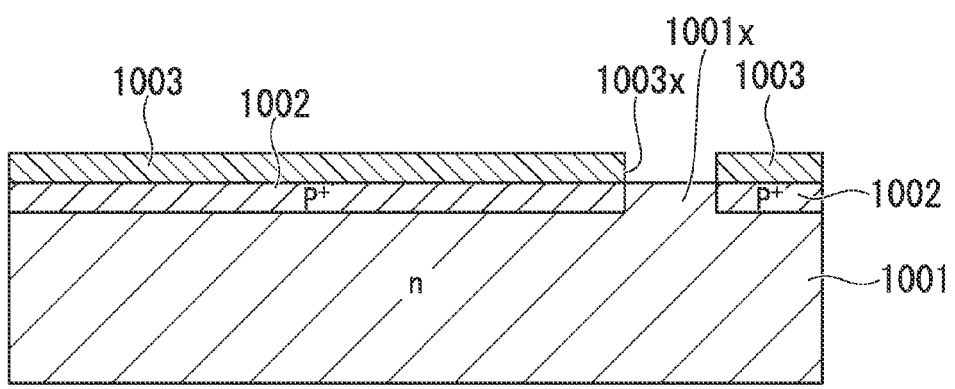
FIG. 7B is an explanatory diagram showing the defect caused in the case where pre-wetting is not conducted.
Figure 7C:
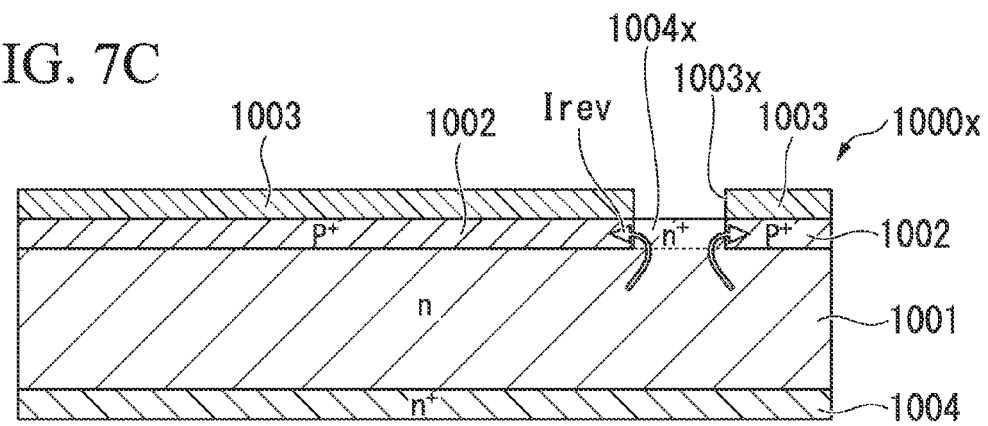
FIG. 7C is an explanatory diagram showing the defect caused in the case where pre-wetting is not conducted.

FIG. 7A to FIG. 7C are explanatory diagrams showing the defect caused in the case where pre-wetting is not conducted. FIG. 7A and FIG. 7B correspond to FIG. 3C and FIG. 3D, respectively, and FIG. 7C corresponds to FIG. 1.

In the case where the amount of the diffusing material 200 dripped is reduced in order to suppress the amount of the diffusing agent used, if pre-wetting is not conducted, formation defects of the coating film such as voids and uncoated parts are likely to occur. FIG. 7A shows the case where a diffusing material 200 is applied to a substrate W, and a void 200x is formed in the coating film of the diffusing material 200.

In the case where the coating state of the diffusing material 200 is such that a void 200x is formed as described above, when a first impurity diffusion layer is formed by heat treatment, the p$^+$Si layer 1002 is not formed at a position corresponding to the void 200x. Further, at the position corresponding to the void 200x, the oxide film 1003 is not formed, and a void 1003x is formed. On the bottom of the void 1003x, the nSi layer 1001 (nSi layer 1001x) remaining on the surface of the substrate is exposed (FIG. 7B).

When such a substrate is used to form a second impurity diffusion layer with a gas containing an impurity element in the manner as described above, the n$^+$Si layer 1004 is formed on the other face of the substrate. Furthermore, the second impurity diffusion layer (n$^+$Si layer 1004x) is also formed on the nSi layer 1001 exposed inside the void 1003 (FIG. 7C). That is, a solar cell substrate 1000x is obtained in a state where the p$^+$Si layer 1002 and the n$^+$Si layer 1004x are mutually adjacent on the same layer.

In the case where a solar cell is produced using such a solar cell substrate 1000x, at the time of power generation, reverse current Irev is likely to be generated at a pn junction portion of the p$^+$Si layer 1002 and the n$^+$Si layer 1004x, and the solar cell is likely to suffer hot spot.

In the production of a solar cell, the entire substrate W used in the production becomes the actual solar cell product, and in the case where a void 200x is formed during the coating of the diffusing material 200, it is not possible to employ an operation to selectively discard the defect portion around the void 200x. Therefore, defects in the production of a solar cell as shown in FIG. 7A to FIG. 7C affect the entire solar cell.

In contrast, in the method of producing a solar cell according to the present embodiment, since the diffusing material 200 is spin-coated after pre-wetting is conducted using the pre-wet composition 210, formation defects of the coating film of the diffusing agent is unlikely to be generated, and it becomes possible to produce a high-quality solar cell.

The method of producing a solar cell according to the present embodiment is as follows.

Herebelow, one example of an apparatus configuration capable of working the method of producing a solar cell according to the present embodiment will be described.

Figure 8A:
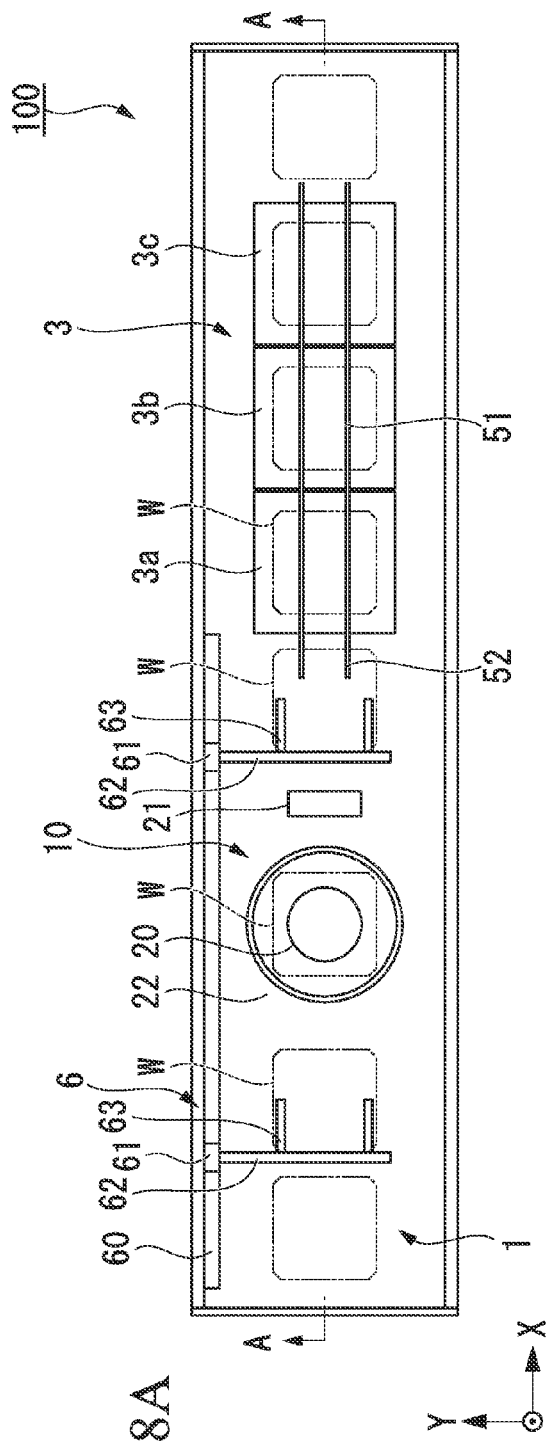
FIG. 8A is an explanatory diagram showing a substrate processing apparatus for working the method of producing a solar cell according to the present embodiment.
Figure 8B:
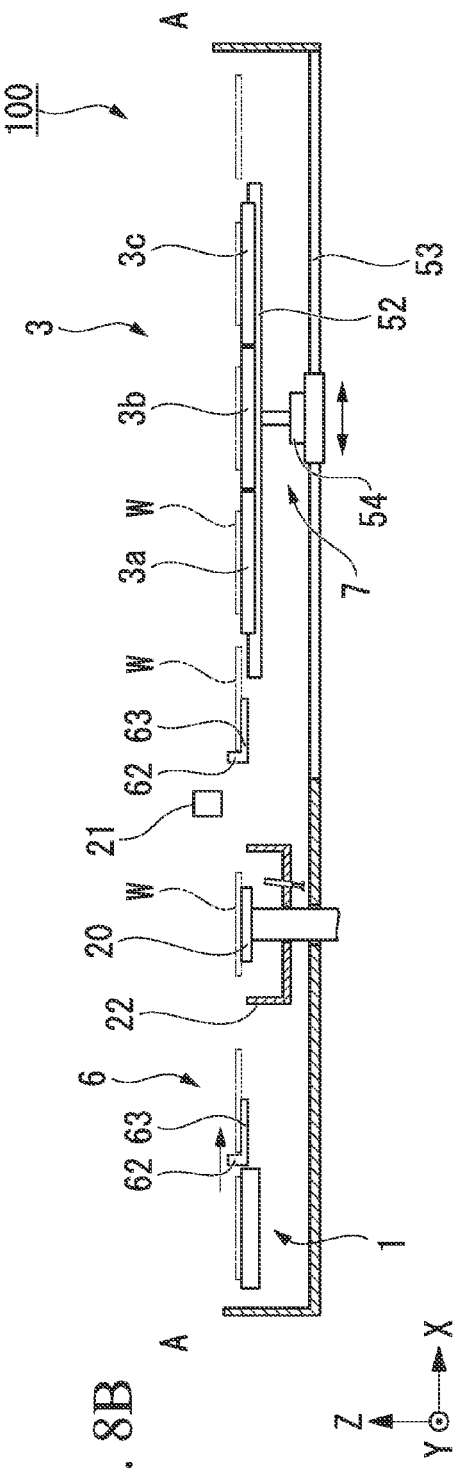
FIG. 8B is an explanatory diagram showing a substrate processing apparatus for working the method of producing a solar cell according to the present embodiment.
Figure 9:
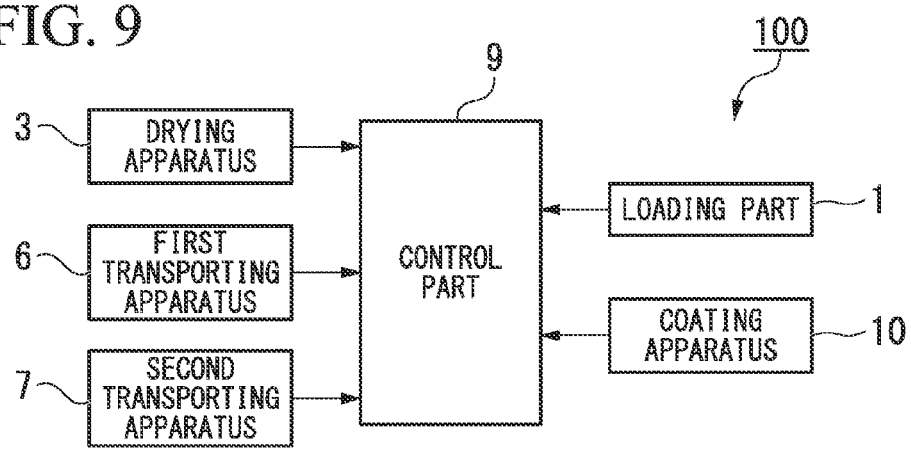
FIG. 9 is a block diagram showing an electric configuration of the substrate processing apparatus.

FIG. 8A is an explanatory diagram showing a plan view of a substrate processing apparatus for working the method of producing a solar cell according to the present embodiment, and FIG. 8B is a cross-sectional view taken along the A-A line in the arrow direction in FIG. 8A. FIG. 9 is a block diagram showing an electric configuration of the substrate processing apparatus 100.

Hereinbelow, upon describing the configuration of the substrate processing apparatus 100, for the purpose of simple marking, an XYZ coordinate system is used to describe the directions in the drawings. The longitudinal direction of the substrate processing apparatus 100 and the transporting direction of the substrate is marked as the X direction. The direction perpendicular to the X direction (substrate transporting direction) in the plan view is marked as the Y direction. The direction perpendicular to a plane including the X and Y axes is marked as the Z direction. In the X, Y, and Z directions, the arrow direction in the drawing is the +direction, and the opposite direction of the arrow direction is the −direction.

As shown in FIG. 8A and FIG. 8B, the substrate processing apparatus 100 is equipped with a loading part 1 for loading a substrate W to be treated, a coating apparatus 10 provided on the downstream side (+X direction) of the loading part 1, a drying apparatus 3 provided on the downstream side (+X direction) of the coating apparatus 10, a first transporting apparatus 6 which transports the substrate W from the loading part 1 to the drying apparatus 3, and a second transporting apparatus 7 which transports the substrate W in the drying apparatus 3.

As shown in FIG. 9, the substrate processing apparatus 100 is equipped with a control part 9 which controls the actuation of each of the loading part 1, the coating apparatus 10, the drying apparatus 3, the first transporting apparatus 6 and the second transporting apparatus 7.

The drying apparatus 3 is constituted of 3 hot plates 3a, 3b and 3c which are arranged in this order in toward the downstream side (+X direction). Each of the hot plates 3a, 3b and 3c is divided into three in the direction perpendicular to the substrate transporting direction (Y direction), and each of the hot plates 3a, 3b and 3c has a gap 51 formed.

The second transporting apparatus 7 includes a thin-plate substrate supporting member 52 which is capable of advancing/retreating between the back side and front side of the hot plates 3a, 3b and 3c via the gap 51, a guide rod 53 which guides the substrate supporting member 52 along the X direction, and a cylinder unit 54 which moves the substrate supporting member 52 along the X direction in line with the guide rod 53. The drying apparatus 3 is electrically connected to the control part 9, and actuation of each of the hot plates 3a, 3b and 3c are controlled by the control part 9.

The coating apparatus 10 includes a chuck part 20 which holds the substrate W, a nozzle part 21 which drips a diffusing material to the substrate W held by the chuck part 20, and a cup part (anti-scattering cup) 22 which accommodates the chuck part 20 rotating. The coating apparatus 10 is the so-called spin-coater. The coating apparatus 10 is electrically connected to control part 9, and the operation of the chuck part 20 is controlled by the control part 9.

The first transporting part 6 includes a rail 60 provided along one side (−Y direction) of the substrate processing apparatus 100, a plurality of moving bodies 61 which moves along the rail 60, and a plurality of substrate supporting members 62 which can be lifted up and down from each moving body 61 to an upper side (+Z direction) and support the substrate W. Each substrate supporting member 62 has a plurality of supporting claws 63 which support the substrate W. The first transporting apparatus 6 is electrically connected to the control part 9, and actuations of the moving bodies 61 and the substrate supporting members 62 are controlled by the control part 9.

The first transporting apparatus 6 is capable of actuating the plurality of moving bodies 61 independently. The moving bodies 61 are arranges at positions where each moving body does not interfere with other moving parts when moved along the rail 60. By such configuration, for example, the first transporting apparatus 6 is capable of unloading the substrate W from the coating apparatus 10 after coating of the diffusing material 200 by substrate supporting members 62 provided on one moving body 61 and loading the substrate W into the drying apparatus 3, and at the same timing, loading another substrate W from the loading part 1 into the coating apparatus 10 by substrate supporting members 62 provided on another moving body 61. In such a manner, the substrate processing apparatus 100 shortens the tact required for the coating step of the diffusing material 200 to the substrate W and the drying step.

The second transporting apparatus 7 is electrically connected to the control part 9, and actuation of the cylinder unit 54 is controlled by the control part 9. By conducting an extension operation of the cylinder unit 54 in the Z direction, the second transporting apparatus 7 protrudes the upper end of the substrate supporting member 52 from the gap 51, so as to lift the substrate W on the hot plate 3a. In this state, the substrate supporting member 52 is moved to the downstream side together with the cylinder unit 54 along the guide rod 53. Then, the cylinder unit 54 is compressed, and the and the upper end of the substrate supporting member 52 is lowered below the upper face of the hot plate 3a, so as to transfer the substrate W to the hot plate 3b on the downstream side. By repeating such operations, the substrate W can be sequentially transferred to the hot plate 3c on the downstream side.

Figure 10A:
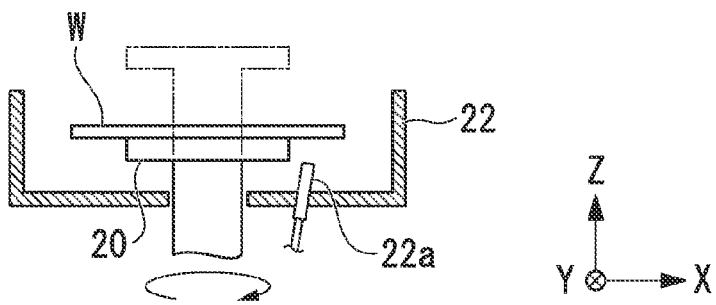
FIG. 10A is a diagram showing a main configuration of a coating apparatus.
Figure 10B:
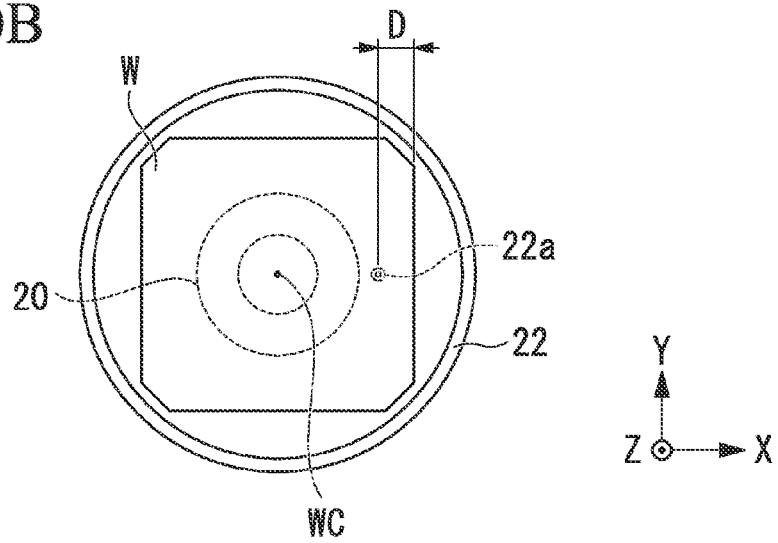
FIG. 10B is a diagram showing a main configuration of a coating apparatus.

FIG. 10A and FIG. 10B are diagrams showing a main configuration of the coating apparatus 10. FIG. 10A shows a side-sectional view, and FIG. 10B shows a plan view. In FIG. 10A and FIG. 10B, a state where the substrate W is disposed inside the coating apparatus 10 is shown.

As shown in FIG. 10A, the chuck part 20 is rotatable in a state where the substrate W is held by suction, and is capable of being lifted up and down relative to the cup part 22. Specifically, the chuck part 20 is capable of being lifted up and down from a mounting position where the substrate W is mounted (substrate mounting position) to a rotating position where the rotation operation is conducted inside the cup part 22 (rotating position).

The cup part 22 prevents the diffusing agent dripped on the substrate W from being scattered around the substrate, and is equipped with a back face cleaning nozzle (cleaning nozzle) 22a which cleans a back side of the substrate W. The back face cleaning nozzle 22a is connected to a cleaning liquid supply source (not shown). The cleaning liquid supply source is configured to eject the cleaning liquid from the back face cleaning nozzle 22a by pressurization.

As shown in FIG. 10B, the chuck part 20 according to the present embodiment is circular in the plan view. On the other hand, since the substrate W held by the chuck part 20 is for use in a solar cell, the substrate W is square-shaped in the plan view, and has the four corners rounded off.

The chuck part 20 has a diameter 40 to 70% of the length of the short side of the substrate W. In the present embodiment, the diameter of the chuck part 20 is, for example, about ⅔ of the length of the short side of the substrate W. Since the chuck part 20 has a diameter 40 to 70% of the length of the short side of the substrate W, and the four corners of the substrate W is rounded off, when the substrate W is likely to rattle during rotation, the chuck part 20 is capable of satisfactorily holding the substrate W. Further, even in the case where a substrate W having a small thickness is used, the chuck part 20 is capable of reliably holding the substrate W.

Next, the configuration relationship of the chuck part 20 and the back face cleaning nozzle 22a will be explained. As shown in FIG. 10B, the back face cleaning nozzle 22a is disposed approximately middle between the outer edge of the chuck 20 and the outer edge of the substrate W. According to the above configuration, the cleaning liquid can be supplied to the back face of the substrate W rotated by the chuck part 20 at a position approximately concentric relative to the outer edge of the chuck part 20.

The coating apparatus 10 is capable of conducting the so-called back rise treatment in which an alcohol as a cleaning liquid is ejected from the back face cleaning nozzle 22a to the back face of the substrate W at the same timing as dripping the diffusing material on the surface of the substrate W. Examples of the alcohol as the cleaning liquid include alcohols having 1 to 5 carbon atoms, such as methanol, ethanol, propanol, butanol, 3-methoxy-3-methyl-1-butanol and 3-methoxy-1-butanol.

Specifically, in the present embodiment, the distance D of the back face cleaning nozzle 22a from the outer edge of the short side of the substrate W held by the chuck part 20 is within 10 mm. By such configuration, the cleaning liquid supplied from the back face cleaning nozzle 22a to the back face of the substrate W is satisfactorily spread to the outer edge of the substrate W, and by preventing the diffusing material from sneaking to the back face of the substrate W, there is no need to separately conduct a back rinse treatment after coating of the diffusing material, thereby shortening the tact of the coating step.

Figure 11:
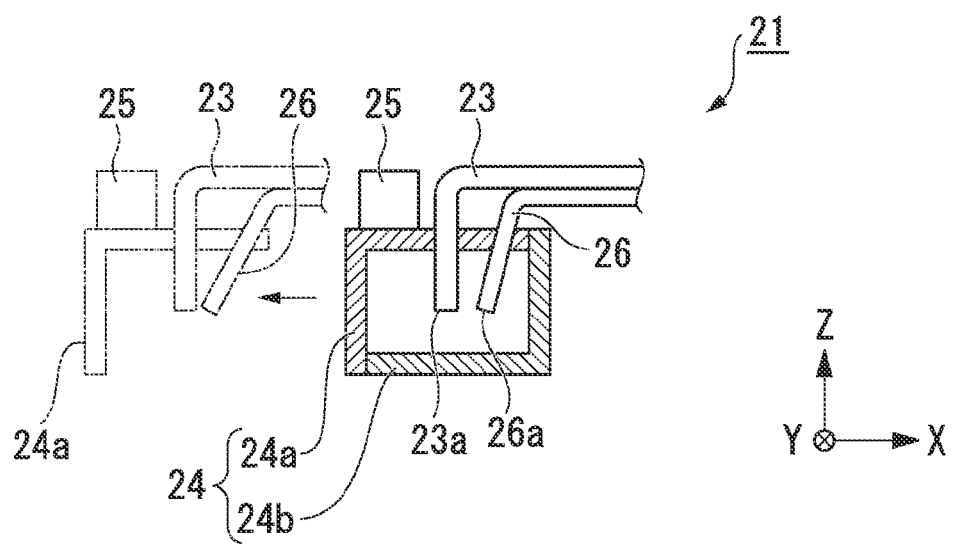
FIG. 11 is a diagram showing a main configuration of a nozzle part.

FIG. 11 is a diagram showing a main configuration of the nozzle part 21.

As shown in FIG. 11, the nozzle part 21 includes a first nozzle 23 provided with an opening 23a from which the diffusing material 200 is dripped, a second nozzle 26 provided with an opening 26a from which the pre-wet composition 210 is dripped, and an accommodation part 24 which accommodates the first nozzle 23 and the second nozzle 26.

As shown in FIG. 11, the accommodation part 24 includes a lid part 24a integrally provided with the first nozzle 23 and the second nozzle 26, and a main body 24b which forms a closed space that accommodates a portion of the first nozzle 23 and the second nozzle 26 (tip portion) together with the lid part 24a. In such a manner, by accommodating the tip portions of the first nozzle 23 and the second nozzle 26 in a closed state, the accommodation part 24 is capable of preventing the openings 23a and 26a from getting dried. The lid part 24a moves together with the first nozzle 23 and the second nozzle 26, and the main body 24b does not move from the standby position of the nozzle part 21.

In the present embodiment, the first nozzle 23 and the second nozzle 26 are integrally held by the lid part (holding member) 24a. The first nozzle 23 is disposed such that the opening 23a is arranged in the vertical direction (Z direction). That is, the first nozzle 23 is held by the lid part 24a such that the dripping direction of the droplets of the diffusing agent dripped from the opening 23a is along the vertical direction.

On the other hand, the second nozzle 26 is disposed such that the axis which runs through the center of the opening 26a is inclined relative to the vertical direction (Z direction). That is, the second nozzle 26 is held by the lid part 24a such that the dripping direction of the droplets of the pre-wet composition dripped from the opening 26a is inclined relative to the vertical direction.

The first nozzle 23 held by the lid part 24a is capable of dripping the diffusing agent from an upper side of the substrate W in the vertical direction. On the other hand, the second nozzle 26 is held by the lid part 24a such that, when the first nozzle 23 is disposed at a position where the diffusing agent can be dripped to a central portion of the substrate W, the second nozzle 26 can drip the pre-wet composition from diagonally upper side of the central portion WC of the substrate W to the central portion of the substrate W. That is, in the present embodiment, the lid part 24a constitutes a regulation means which regulates the landing position of the droplets of the pre-wet composition such that the droplets are dripped on the central portion of the substrate W.

The fixing angle of the second nozzle 26 on the lid part 24a, i.e., the inclination angle of the axis of the second nozzle 26 relative to the vertical direction may be appropriately selected depending on the positional relation of the substrate W and the openings 23a and 26a and the sizes of the nozzles 23 and 26. For example, the angle is preferably set in the range of 30 to 45°, and more preferably 45°. It is not always necessary that the second nozzle 26 is entirely inclined, and a configuration in which only the tip portion is inclined at the above angle may be employed. By such configuration, the space for installing the second nozzle 26 can be saved, and the size of the nozzle part 21 can be reduced.

The nozzle part 21 includes a transfer mechanism (transfer part) 25 which transfers the lid part 24a. The transfer mechanism 25 is capable of integrally transferring (advancing/retreating) the first nozzle 23 and the second nozzle 26 relative to the chuck part 20. By such configuration, the first nozzle 23 and the second nozzle 26 are capable of being advanced/retreated in parallel to the loading direction of the substrate W on the chuck part 20. As a result, the transfer distance of the first nozzle 23 and the second nozzle 26 can be reduced, and the tact of the entire coating process can be shortened.

Further, inside the first nozzle 23, a flow path (not shown) which allows the diffusing material 200 to flow to the opening 23a is provided, and the flow path is connected to a diffusing material supply source (not shown).

The diffusing material supply source has, for example, a pump (not shown). By pushing out the diffusing material to the opening 23a, the diffusing material 200 is dripped from the opening 23a.

Further, inside the second nozzle 26, a flow path (not shown) which allows the pre-wet composition 210 to flow to the opening 26a is provided, and the flow path is connected to a pre-wet composition supply source (not shown). The pre-wet composition supply source has, for example, a pump (not shown). By pushing out the pre-wet composition to the opening 26a, the pre-wet composition 210 is dripped from the opening 26a.

Next, the operation of the substrate processing apparatus 100 will be described, mainly with respect to the coating step of the diffusing material on the substrate W by the coating apparatus 10.

Figure 12:
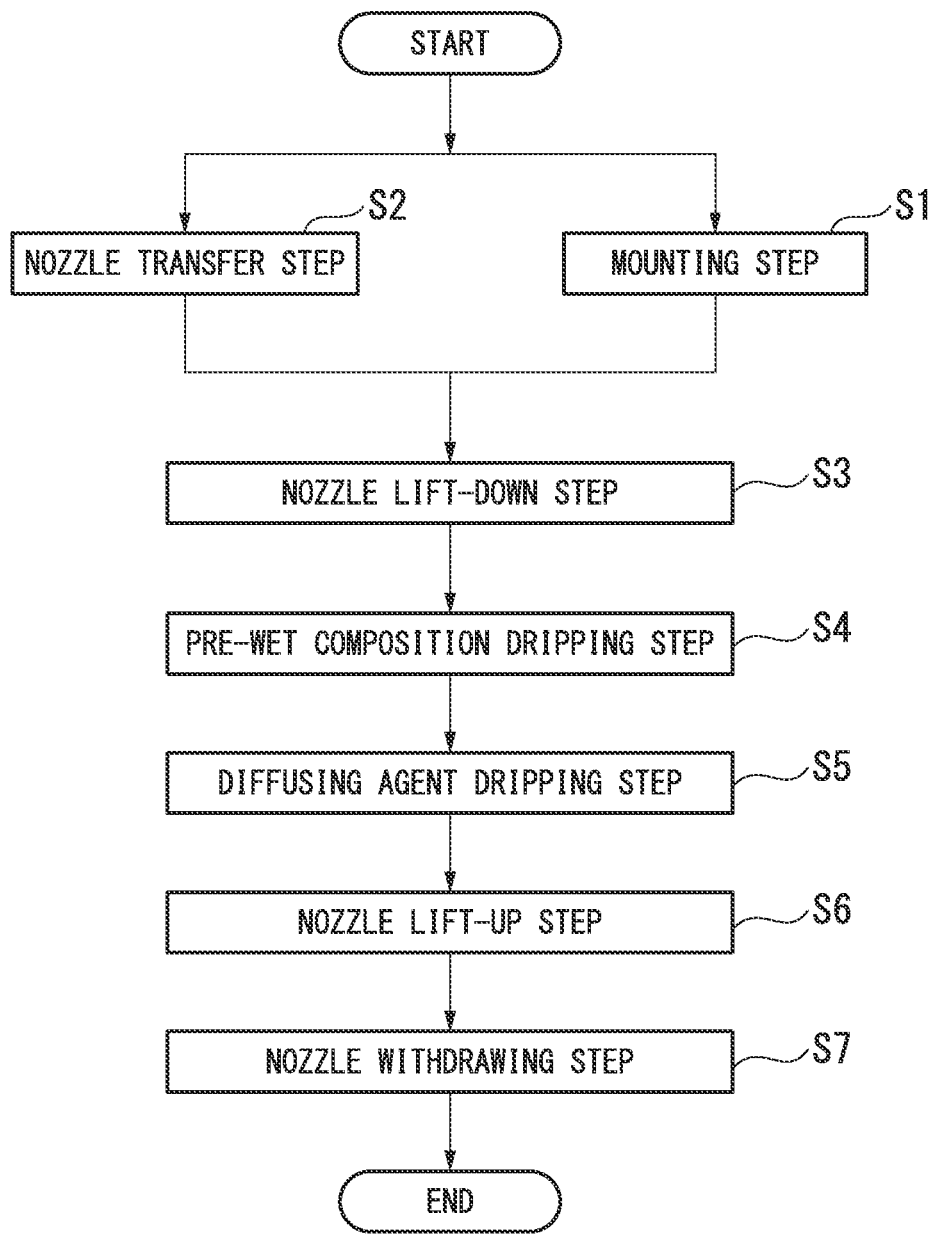
FIG. 12 is a flow chart showing a coating process of a diffusing material by a coating apparatus.

FIG. 12 is a flow chart showing a coating process of a diffusing material by the coating apparatus 10.

The coating step of the diffusing material by the coating apparatus 10 includes a mounting step S1, a nozzle transfer step S2, a nozzle lift-down step S3, a pre-wet composition dripping step S4, a diffusing material dripping step S5, a nozzle lift-up step S6 and a nozzle withdrawing step S7.

The coating step performed by the coating apparatus 10 corresponds to step S12 in FIG. 2.

The mounting step S1 is a step in which a substrate W is mounted on the chuck part 20 at a substrate mounting position.

The nozzle transfer step S2 is a step in which the nozzle part 21 is transferred to the upper side of the chuck part 20 at the substrate mounting position.

The nozzle lift-down step S3 is a step in which the chuck part 20 having the substrate W mounted thereon is transferred from the substrate mounting position to the rotating position where the rotating operation is conducted inside the cup part 22, and the nozzle part 21 is lifted down.

The pre-wet composition dripping step S4 is a step in which the pre-wet composition 210 is dripped from the opening 26a of the second nozzle 26 to the substrate W on the chuck part 20 transferred to the rotating position, and the chuck part 20 is rotated.

The diffusing material dripping step S5 is a step in which the diffusing material 200 is dripped from the opening 23a of the first nozzle 23 to the substrate W having the pre-wet composition 210 dripped thereon, and the chuck part 20 is rotated.

The nozzle lift-up step S6 is a step in which the nozzle part 21 is lifted up to withdraw the nozzle part 21 from the chuck part 20.

The nozzle withdrawing step S7 is a step in which the nozzle part 21 is withdrawn from the inside of the cup part 22.

Hereinbelow, referring to FIG. 13A to FIG. 13F, the coating step will be described.

Firstly, as shown in FIG. 13A, the substrate processing apparatus 100 passes the substrate W loaded from the loading part 1 to the coating apparatus 10 by the first transporting apparatus 6 (mounting step S1). At this time, the chuck part 20 is lifted up to the mounting position where the substrate W transferred by the substrate supporting member 62 is to be mounted. Further, in preparation of a subsequent coating step, the substrate processing apparatus 100 loads another substrate W inside the loading part 1.

In the present embodiment, for example, at the same timing as mounting the substrate W on the chuck part 20, the nozzle part 21 faces the substrate W (nozzle transfer step S2). Specifically, the nozzle part 21 is transferred to a position where the opening 23a of the first nozzle 23 faces the central portion WC of the substrate W. Since the nozzle part 21 faces the substrate W at the same timing as when the substrate W is mounted on the chuck part 20 as described above, the waiting time of transferring the nozzle part 21 to the chuck part 20 can be eliminated, and the tact can be shortened.

As shown in FIG. 13B, when the substrate W is mounted, the control part 9 (see FIG. 9) actuates the chuck part 20 so as to suction and hold the substrate W, and controls the nozzle part 21 to be lifted down together with the chuck part 20 (nozzle lift-down step S3). By lifting down the nozzle part 21 together with the chuck part 20, the distance between the substrate W and the openings 23a and 26a can be maintained at a predetermined value, each material can be satisfactorily dripped onto the substrate W in the later dripping steps.

As shown in FIG. 13C, when the substrate W held by the chuck part 20 reached the rotating position at which the substrate W is rotated inside the cup part 22, the control part 9 (see FIG. 9) controls the chuck part 20 to rotate. The control part 9 drips the pre-wet composition 210 from the opening 26a of the second nozzle 26 to the substrate S while rotating the chuck part 20 (pre-wet composition dripping step S4). In the present embodiment, the second nozzle 26 is held by the lid part 24a such that the pre-wet composition 210 can be dripped from a diagonally upper side of the central portion WC of the substrate W to the central portion WC of the substrate W. Therefore, the second nozzle 26 can allow the droplets dripped from the opening 26a to land on the central portion WC of the substrate W.

After dripping a predetermined amount (e.g., 2.0 ml) of the pre-wet composition 210 from the second nozzle 26 onto the substrate W, the control part 9 (see FIG. 9) rotates the chuck part 20 for a predetermined time.

In the present embodiment, in the pre-wet composition dripping step S4, for example, the chuck part 20 is rotated at a rotation number of 800 rpm for 3 seconds. In this manner, the pre-wet composition 210 dripped on the central portion WC of the substrate W is wet-spread on the entire substrate W.

Subsequently, as shown in FIG. 13D, the control part 9 (see FIG. 9) drips the diffusing material 200 from the opening 23a of the first nozzle 23 to the substrate W while rotating the substrate W held by the chuck part 20 in the cup part 22 (diffusing material dripping step S5). In the present embodiment, the first nozzle 23 is held by the lid part 24a such that the diffusing material 200 can be dripped from the upper side of the central portion WC of the substrate W to the central portion WC of the substrate W. Therefore, the first nozzle 23 can allow the droplets dripped from the opening 23a to land on the central portion WC of the substrate W.

The control part 9 (see FIG. 9) rotates the chuck part 20 for a predetermined time while dripping the diffusing material 200 from the first nozzle 23 onto the substrate W. In the present embodiment, for example, the chuck part 20 is rotated at a rotation number of 800 rpm for 0.5 to 1.0 seconds. In this manner, the diffusing material 200 can be wet-spread to the extent where the diffusing material 200 does not spread out of the surface of the substrate W.

After dripping a predetermined amount of the diffusing material 200 from the first nozzle 23 to the substrate W, as shown in FIG. 13E, the control part 9 (see FIG. 9) controls the nozzle part 21 to be lift up (nozzle lift-up step S6). The control part 9 rotates the chuck part 20 for a predetermined time while lifting up the nozzle part 21. In the present embodiment, for example, the chuck part 20 is rotated at a rotation number of 2,000 rpm within 5 seconds.

In this manner, the diffusing agent 200 dripped on the central portion WC of the substrate W is wet-spread on the entire substrate W. In this manner, the diffusing material 200 can be shaken off the surface of the substrate W.

In the present embodiment, since the first nozzle 23 which drips the diffusing material 200 is disposed above the central portion WC of the substrate W in the vertical direction, the diffusing material 200 can be precisely dripped onto the central portion WC of the substrate W, as compared to the case where the first nozzle 23 is disposed in an inclined state like the second nozzle 26. Therefore, by dripping only a small amount (e.g., about 1.5 ml) of the diffusing material 200, the diffusing material 200 can be wet-spread over the entire face of the substrate W. Further, in the present embodiment, by virtue of the pre-wet composition 210 being applied over the entire face of the substrate W thereby increasing the wettability, the diffusing agent 200 is wet-spread over the entire face of the substrate W in a short time. Hence, in the present embodiment, the diffusing material 200 can be precisely applied to the substrate W with a short tact.

After lifting up the nozzle part 21 to a predetermined height, as shown in FIG. 13F, the control part 9 controls the nozzle part 21 to be withdrawn from the position facing the chuck part 20 to the standby position (nozzle withdrawing step S7). When the nozzle part 21 is withdrawn from the chuck part 20, the chuck part 20 is rotated at a rotation number of 2,000 rpm. The first nozzle 23 and the second nozzle 26 are accommodated in the accommodation part 24 which is constituted by the lid part 24a contacting the main body 24b at the standby position (see FIG. 11).

In the present embodiment, it is preferable that the chuck part 20, for example, is accelerated from a rotation number of 800 rpm to a rotation number of 2,000 rpm $\phi$ within 1.0 seconds, and decelerated from a rotation number of 2,000 rpm to a rotation number of 0 rpm within 0.5 seconds at the time of stopping the rotating operation. In this manner, the entire tact required for the coating treatment of the diffusing material 200 on the substrate W can be suppressed to 15 to 18 seconds.

Further, the coating film of the diffusing agent formed on the substrate W can be rendered to become a semi-dried state.

In the apparatus according to the present embodiment, simultaneously with the rotation of the chuck part 20, a back rinse treatment is conducted in which an alcohol as a cleaning liquid is ejected from the back face cleaning nozzle 22a to the back face of the substrate W. The ejection of the cleaning liquid is started within 3 seconds from starting the rotation of the chuck part 20.

According to the apparatus of the present embodiment, as described above with reference to FIG. 10A and FIG. 10B, since the back face cleaning nozzle 22a is disposed within 10 mm from the outer edge of the substrate W, the cleaning liquid supplied to the back face of the substrate W can be satisfactorily spread to the outer edge of the substrate W. By such configuration, the diffusing material 200 can be prevented from sneaking to the back face of the substrate W, and there is no need to separately conduct a back rinse treatment after the coating step. As a result, the tact of the coating step can be greatly shortened.

After finishing the rotating operation, the chuck part 20 is lifted up to be withdrawn from the cup part 22. Thereafter, the control part 9 actuates the substrate supporting member 62 of the first transporting apparatus 6, so as to receive the substrate W from the chuck part 20 and transport the substrate W into the drying apparatus 3. Then, the diffusing material 200 on the substrate W is dried.

In the present embodiment, after unloading the substrate W having the diffusing material 200 coated thereon from the chuck part 20, the control part 9 passes another substrate W from the loading part 1 to the coating apparatus 10. At this time, the control part 9 mounts the substrate W on the chuck part 20 using another substrate supporting member 62 of the first transporting apparatus 6. Then, while loading the substrate W having been coated with the diffusing material 200 into the drying apparatus 3, the diffusing material 200 is applied to the substrate W inside the coating apparatus 10.

Subsequently, the control part 9 loads the substrate W into the drying apparatus 3. The drying apparatus 3 conducts a drying treatment for each substrate W at 150° C. for 10 seconds using hot plates 3a, 3b and 3c. Based on such configuration, the substrate processing apparatus 100 is capable of loading a substrate W into the drying apparatus 3 every 10 seconds. By sequentially transporting the substrate W unloaded from the coating apparatus 10 into the drying apparatus 3, the process speed can be greatly improved.

Specifically, the substrate processing apparatus 100 mounts the substrate W which has been coated with the diffusing material 200 on the hot plate 3a positioned most upstream. The hot plate 3a dries the substrate W at 150° C. for 10 seconds. Then, the control part 9 compresses the cylinder unit 54, and lifts down the substrate supporting member 52 such that the upper end of thereof is lower than the upper face of the hot plate 3a, so as to transfer the substrate W to the hot plate 3b on the downstream side. The hot plate 3b dries the substrate W at 150° C. for 10 seconds. Then, the control part 9 compresses the cylinder unit 54, and lifts down the substrate supporting member 52 such that the upper end of thereof is lower than the upper face of the hot plate 3b, so as to transfer the dried substrate W to the hot plate 3c on the downstream side. The hot plate 3c dries the substrate W at 150° C. for 10 seconds. In this manner, the substrate W can be subjected to a drying treatment at 150° C. for 30 seconds.

Alternatively, the heating temperatures of the hot plates 3a, 3b and 3c may be differentiated. For example, the hot plate 3a may heat the substrate W at 60° C. for 10 seconds, the hot plate 3b may heat the substrate W at 120° C. for 10 seconds, and the hot plate 3c may heat the substrate W at 150° C. for 10 seconds, so as to dry the substrate W.

In the present embodiment, the substrate W is transferred from the hot plate 3a to the hot plate 3b, and at the same time, the substrate supporting member 62 if the first transporting member 6 mounts the substrate W unloaded from coating apparatus 10 on the hot plate 3a. Further, one substrate W is transferred from the hot plate 3b to the hot plate 3c, and at the same time, an unloading arm (not shown) unloads another substrate W on the hot plate 3c from the substrate processing apparatus 100.

Thus, in the present embodiment, each substrate W is sequentially transferred to the hot plates 3a, 3b and 3c, so as to conduct a heat treatment of the diffusing material 200. In this manner, a diffusing film can be formed on the surface of the substrate W.

By working the method of producing a solar cell according to the present embodiment by a coating apparatus 10 as described above, since the nozzle part 21 of the coating apparatus 10 is equipped with a second nozzle 26 capable of dripping the pre-wet composition 210 from a diagonally upper side of the central portion WC of the substrate W to the central portion WC of the substrate W, after transferring the nozzle part 21 above the substrate W, the pre-wet composition 210 and the diffusing material 200 can be dripped onto the substrate W without moving the positions of the first nozzle 23 and the second nozzle 26. As such, since the transfer time of the nozzles 23 and 26 for dripping the materials 200 and 210 onto the substrate W can be eliminated, the tact required for the coating treatment of the diffusing material 200 on the substrate W can be shortened.

Further, in the nozzle lift-down step S3, a configuration is employed in which the chuck part 20 having the substrate W mounted thereon is transferred from the substrate mounting position to the rotating position where the rotating operation is conducted in the cup part 22, and the nozzle part 21 is lifted down. As a result, dripping of the pre-wet composition 210 can be started at the timing when the chuck part 20 reaches the rotating position, and the tact for the coating treatment can be shortened. Furthermore, a configuration is employed in which the nozzle lift-up step S6 is conducted before finishing the rotating operation of the chuck part 20. As a result, when the rotating operation of the chuck part 20 is finished, the nozzle part 21 is not disposed above the chuck part 20, and by increasing the speed of lifting up the chuck part 20, the tact for the coating treatment can be shortened. Moreover, by controlling at the timing of the pre-wet composition dripping step S4 and the diffusing material dripping step S5, a coating apparatus 10 having a conventional configuration may be employed. As a result, the cost of the substrate processing apparatus 100 can be reduced.

The method of producing a solar cell according to the present embodiment is not limited to the above apparatus configuration, and is workable with other apparatuses.

In the present embodiment, example was given with respect to a case where the second nozzle 26 is held by the lid part 24a such that the axis which runs through the center of the opening 26a is inclined relative to the vertical direction (Z direction). However, the first nozzle 23 may be held by the lid part 24a in an inclined state, as long as the diffusing material 200 can be satisfactorily dripped onto the central portion WC of the substrate W. Alternatively, each of the first nozzle 23 and the second nozzle 26 may be held by the lid part 24a in an inclined state.

Further, in the present embodiment, example was given with respect to a case where the lid part 24a constitutes a regulation means which regulates the landing position of the droplets of the pre-wet composition 210 such that the droplets are dripped on the central portion WC of the substrate W. However, the present embodiment is not limited thereto.

Figure 14:
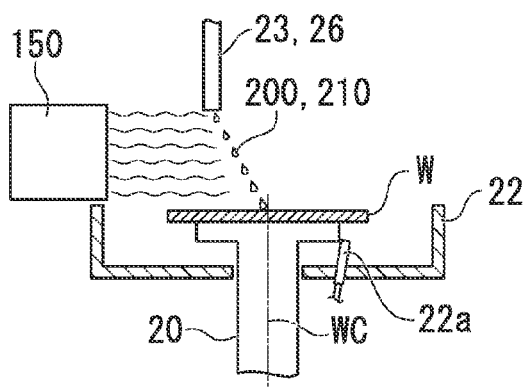
FIG. 14 is a diagram showing a modified example of a substrate processing apparatus.

For example, as shown in FIG. 14, an adjustment apparatus 150 which adjust the trajectory if the droplets by applying a physical external force may constitute a regulation means which regulates the landing position of the droplets of the pre-wet composition such that the droplets are dripped on the central portion of the substrate W. Such adjustment apparatus 150 may be constituted of, for example, an air jetting apparatus, a magnetic force generating apparatus or the like. In an adjustment apparatus 150 constituted of an air jetting apparatus, by adjusting the amount of air jetted, the trajectory of the droplets of at least one of the materials 200 and 210 dripped from the first nozzle 23 and the second nozzle 26 is adjusted, and the droplets can be landed on the central portion WC of the substrate W. In an adjustment apparatus 150 constituted of a magnetic force generating apparatus, by adjusting the amount of magnetic force generated, the trajectory of the droplets of at least one of the materials 200 and 210 dripped from the first nozzle 23 and the second nozzle 26 is adjusted by the magnetic force, and the droplets can be landed on the central portion WC of the substrate W.

According to the method of producing a solar cell as described above, the amount of the diffusing agent used can be suppressed, and also formation defect of the coating film of the diffusing agent can be suppressed while shortening the tact time.

In the present embodiment, a textured structure is formed on the face Wa of the substrate W. However, the present embodiment is not limited thereto. Even if the face Wa does not have a textured structure, by pre-wetting with the pre-wet composition 210, formation defect of the coating film of the diffusing agent can be suppressed.

Furthermore, in the present embodiment, explanation was given about a case where a textured structure is formed on the face Wa of the substrate W, and a monofacial power generation solar cell in which the face Wa is used as a light receiving face is produced. However, the production method of the present invention is also applicable to the production of a bifacial power generation solar cell which uses both faces of the substrate as light receiving faces. In the case of a bifacial power generation solar cell, it is preferable to form a textured structure not only on the face Wa of the substrate W, but also on the other face. By virtue of forming a textured structure also on the other face, the utilization efficiency of the solar ray entering the other face, and a solar cell capable of generating power with high efficiency can be obtained.

Hereabove, examples of the preferred embodiments of the present invention has been described with the accompanying drawings, it should be understood that these are exemplary of the invention and are not to be considered as limiting. The form and combinations of the components shown in the aforementioned embodiment is only one example, and can be modified depending on the design requirements without departing from the spirit or scope of the present invention.

For example, in the above embodiment, explanation was given taking example of a method of producing a solar cell using a n-type substrate, and, hence, a boron compound (a compound of a group 13 element) is used as the diffusing agent. However, the present invention is also applicable to a method of producing a solar cell using a p-type substrate. In such a case, a diffusing material using the aforementioned compound containing a group 15 element is prepared, and the surface of the substrate is pre-wetted, followed by spin-coating the diffusing material, thereby forming a preferable coating film of the diffusing agent. Further, the present invention is also applicable to the case where a compound containing a group 15 element is applied to a face (one face) of a p-type substrate, and a boron diffusing material is applied to the face on the other side (other face).

As the p-type substrate, not only a monocrystalline silicon produced by the aforementioned CZ process (Czochralski process), the FZ process (Floating Zone process) or the like, but also a multi crystalline silicon may be used.

Example

As follows is a description of examples of the present invention, although the scope of the present invention is by no way limited by these examples.

Example

One face of a n-type monocrystalline silicon substrate (diagonal length: 200 mm, edge (linear portion): 156 mm, thickness: 180 μm) was subjected to anisotropic etching using an alkali solution, so as to form a textured structure on the one face.

Subsequently, on the face having the textured structure formed, 1.0 g of a PGME:DIW=1:1 mixed solvent was supplied, and the mixed solvent was applied to the face by spin-coating. Without stopping the rotation of the substrate, 0.5 g of a diffusing material was supplied on the face having the textured structure formed, and the diffusing material was applied to the face by spin-coating.

As the diffusing material, a boron diffusing material containing a boron diffusing agent and PGME as a solvent (EPLUS (registered trademark), SC-1008, manufactured by Tokyo Ohka) was used.

Further, referring to FIG. 6A, the spin-coating conditions were set as R1=800 rpm, R2=3,000 rpm, T1-T2=5 seconds, T2-T3=1 second, and T4-T5=5 seconds.

After forming the coating film of the diffusing agent, the substrate was sequentially heated and dried at 60° C. for 10 seconds, 120° C. for 10 seconds and 150° C. for 10 seconds, followed by heating in a nitrogen atmosphere at 1,000° C. for 30 minutes, so as to form a $p^+$ impurity diffusion layer. Although the heating was conducted in a nitrogen atmosphere, since a trace amount of oxygen was present, an oxide film was formed on the surface of the substrate.

Subsequently, the substrate was disposed inside a chamber. After purging the inside of the chamber with nitrogen to obtain a nitrogen atmosphere, $POCl_3$ was supplied into the chamber, followed by heating at 900° C. for 15 minutes, so as to form a $n^+$ impurity diffusion layer. In this manner, a solar cell substrate of Example was produced. 150 solar cell substrates were produced.

Comparative Example

The solar cell substrate of Comparative Example was produced in the same manner as in Example, except that pre-wetting was not conducted.

On each of the solar cell substrates of Example and Comparative Example, an anti-reflection film made of silicon nitride was formed, followed by applying a silver electrode on both faces of the solar cell substrate, so as to obtain a solar cell.

With respect to the obtained solar cells, the conversion efficiency (unit: %) and the reverse current (unit: A) were measured in accordance with IEC 60904-3: 2008. The measurement conditions were temperature: 25° C., AM (air mass): 1.5G, and irradiation intensity: 1 kW/m². From the light source, a continuous light was irradiated.

Further, in the measurement of the reverse current, the measurement voltage was −12V.

Figure 15A:
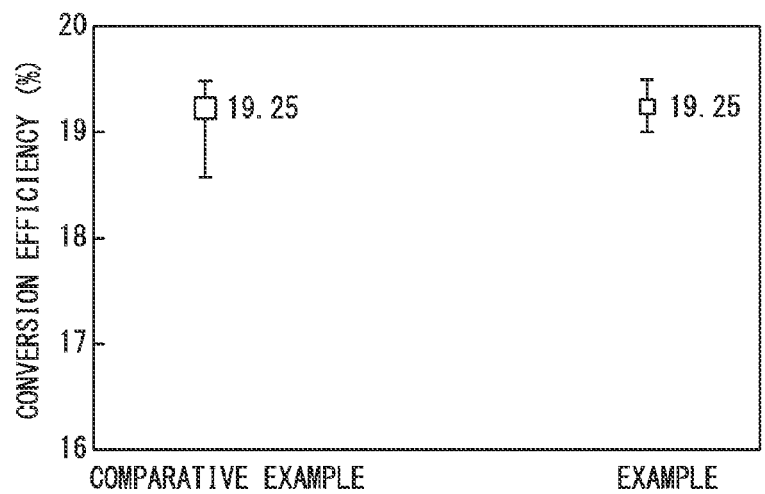
FIG. 15A is a graph showing the results of examples.
Figure 15B:
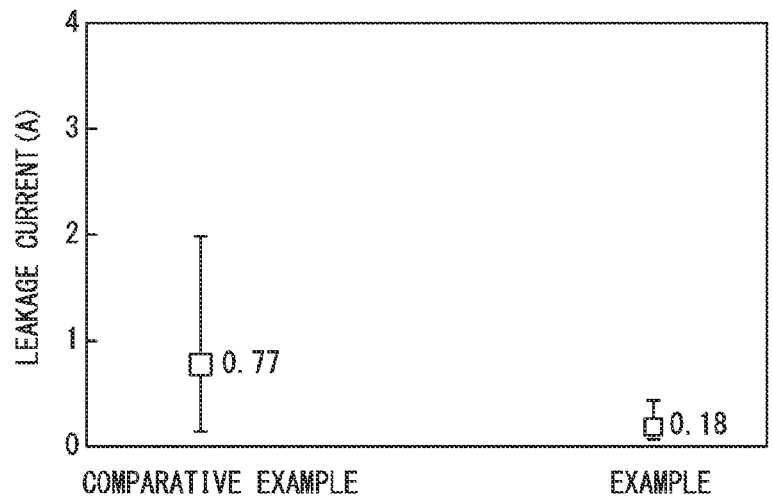
FIG. 15B is a graph showing the results of examples.

FIG. 15A and FIG. 15b are graphs showing the measurement results. FIG. 15A shows the conversion efficiency, and FIG. 15B shows the amount of reverse current. In each graph, the error bar is based on the measurement results of n=150.

From the results of the measurements, it was found that, the conversion efficiency was at about the same level in Example and Comparative Example, but the reverse current was more suppressed in Example than in Comparative Example. It is presumed that, in Example, a coating film of the diffusing agent was satisfactorily formed, and reverse current was suppressed.

From the results shown above, it was found that the present invention is useful.

DESCRIPTION OF REFERENCE CHARACTERS AND NUMERALS

200: diffusing material, 210: pre-wet composition, 1002: $p^+Si$ layer (first impurity diffusion layer), 1004: $n^+Si$ layer (second impurity diffusion layer), T: textured structure, W: substrate, Wa: one face While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of producing a solar cell, comprising:
a first coating step in which a pre-wet composition is spin-coated on one face of a semiconductor substrate;
a second coating step in which a diffusing material including a solvent and a diffusing agent containing a first impurity element is spin-coated on the one face where the pre-wet composition has been spin-coated, so as to form a coating film of the diffusing agent; and a first impurity diffusion layer forming step in which the semiconductor substrate having the coating film formed thereon is heated, so as to form a first impurity diffusion layer in which the first impurity element contained in the diffusing agent is diffused, wherein:
from the start of the first coating step to the end of the second coating step, spin-coating is continuously conducted without stopping rotating the semiconductor substrate,
a maximum substrate rotation number R2 in the second coating step is larger than a maximum substrate rotation number R1 in the first coating step,
in the second coating step, after supplying the diffusing material to the one face, the substrate rotation number in the first coating step is increased to the substrate rotation number in the second coating step,
the maximum substrate rotation number R1 in the first coating step is in the range of 800 rpm to 3,000 rpm, and the maximum substrate rotation number R2 in the second coating step is in the range of 1,000 rpm to 5,000 rpm,
the rotation speed of the semiconductor substrate is accelerated from 0 rpm to the maximum substrate rotation number R1 from the start of the rotation to a time T1 just before applying the pre-wet composition to the semiconductor substrate, and the rotation time of the semiconductor substrate from the start of the rotation to the time T1 is 0.01 to 0.2 seconds,
the rotation speed of the semiconductor substrate is maintained at the maximum substrate rotation number R1 from the time T1 to a time T2 when the spin-coating of the pre-wet composition is finished and just before applying the diffusing material to the semiconductor substrate, and the rotation time of the semiconductor substrate from the time T1 to the time T2 is 0.5 to 5 seconds,
the rotation speed of the semiconductor substrate is maintained at the maximum substrate rotation number R1 from the time T2 to a time T3 when the rotation speed of the semiconductor substrate is started to be accelerated, and the rotation time of the semiconductor substrate from the time T2 to the time T3 is 0.5 to 1 second, the rotation speed of the semiconductor substrate is accelerated from the time T3 to a time T4 when the rotation speed of the semiconductor substrate reaches the maximum substrate rotation number R2, and the rotation time of the semiconductor substrate from the time T3 to the time T4 is 0.1 to 1 second, the rotation speed of the semiconductor substrate is maintained at the maximum substrate rotation number R2 from the time T4 to the time T5 when the spin-coating of the diffusing material is finished, and the rotation time of the semiconductor substrate from the time T4 to the time T5 is 3 to 8 seconds, and the rotation speed of the semiconductor substrate is reduced from the maximum substrate rotation number R2 to 0 rpm from the time T5 to a time T6 when the second coating step is finished, and the rotation time of the semiconductor substrate from the time T5 to the time T6 is 0.1 to 1 second.

2. The method according to claim 1, which comprises, prior to the first coating step, a step in which a textured structure is formed on at least the one face.

3. The method according to claim 1, wherein the second coating step comprises forming the coating film in a semi-dried state.

4. The method according to claim 1, which comprises, after the first impurity diffusion layer forming step, a second impurity diffusion layer formed step in which a second impurity diffusion layer having a second impurity element diffused therein is formed on a second face of the semiconductor substrate, the second face being opposite the first face.

* * * * *